United States Patent
Khalili Amiri et al.

(10) Patent No.: US 8,841,739 B2
(45) Date of Patent: Sep. 23, 2014

(54) SYSTEMS AND METHODS FOR IMPLEMENTING MAGNETOELECTRIC JUNCTIONS

(71) Applicant: The Regents of the University of California, Oakland, CA (US)

(72) Inventors: Pedram Khalili Amiri, Los Angeles, CA (US); Kang L. Wang, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/021,916

(22) Filed: Sep. 9, 2013

(65) Prior Publication Data

US 2014/0070344 A1    Mar. 13, 2014

Related U.S. Application Data

(60) Provisional application No. 61/698,635, filed on Sep. 8, 2012.

(51) Int. Cl.
  *H01L 29/82* (2006.01)
  *H01L 27/22* (2006.01)
(52) U.S. Cl.
  CPC ................ *H01L 27/226* (2013.01)
  USPC .............. 257/421; 365/171; 365/225.5
(58) Field of Classification Search
  USPC .............. 257/421; 365/171, 225.5
  See application file for complete search history.

(56) References Cited

U.S. PATENT DOCUMENTS 7,710,770 B2 * 5/2010 Cowburn et al. .......... 365/173
7,820,064 B2 * 10/2010 Jin ................................ 216/41
7,915,891 B2 * 3/2011 Edelstein ................... 324/244

* cited by examiner

*Primary Examiner* — Ngan Ngo
(74) *Attorney, Agent, or Firm* — John P. O'Banion; Rishi H. Wadhwani

(57) ABSTRACT

Embodiments of the invention implement DIOMEJ cells. In one embodiment, a DIOMEJ cell includes: an MEJ that includes, a ferromagnetic fixed layer, a ferromagnetic free layer, and a dielectric layer interposed between said fixed and free layers, where the fixed layer is magnetically polarized in a first direction, where the free layer has a first easy axis that is aligned with the first direction, and where the MEJ is configured such that when a potential difference is applied across it, the magnetic anisotropy of the free layer is altered such that the relative strength of the magnetic anisotropy along a second easy axis that is orthogonal to the first easy axis, as compared to the strength of the magnetic anisotropy along the first easy axis, is magnified for the duration of the application of the potential difference; and a diode, where the diode and the MEJ are arranged in series.

21 Claims, 25 Drawing Sheets

SYSTEMS AND METHODS FOR IMPLEMENTING MAGNETOELECTRIC JUNCTIONS

CROSS-REFERENCE TO RELATED APPLICATIONS

The current application claims priority to U.S. Provisional Application No. 61/698,635, filed Sep. 8, 2012, the disclosure of which is incorporated herein by reference.

STATEMENT REGARDING FEDERALLY SPONSORED RESEARCH OR DEVELOPMENT

This invention was made with Government support under HR0011-10-C-0153, awarded by the Department of Defense, Defense Advanced Research Projects Agency. The Government has certain rights in the invention.

FIELD OF THE INVENTION

The present invention generally relates to the implementation of magnetoelectric junctions.

BACKGROUND OF THE INVENTION

Devices that rely on the interplay between electricity and magnetism underlie much of modern electronics. Relatively recently, researchers have begun to develop and implement such devices that take advantage of quantum mechanical magnetoresistance effects, such as giant magnetoresistance (GMR) and tunnel magnetoresistance (TMR). GMR and TMR principles regard how the resistance of a thin film structure that includes alternating layers of ferromagnetic and non-magnetic layers depends upon whether the ferromagnetic layers are in a parallel or antiparallel alignment. For example, magnetoresistive random-access memory (MRAM) is a technology that is being developed that typically utilizes TMR phenomena in providing for alternative random-access memory (RAM) devices. In a typical MRAM bit, data is stored in a magnetic polarization within an arrangement that includes two ferromagnetic plates separated by an insulating layer—this arrangement is conventionally referred to as a magnetic tunnel junction (MTJ). One of the ferromagnetic plates (the fixed layer) is permanently set to a particular polarization, while the other ferromagnetic plate (the free layer) can have its magnetic polarization altered. Generally, the MRAM bit can be written to by manipulating the magnetic polarization of the free layer such that it is either parallel or antiparallel with the polarization of the fixed layer; and the bit can be read by measuring its resistance, since the resistance of the bit will depend on whether the polarizations are in a parallel or antiparallel alignment.

MRAM technologies initially exhibited a number of deficiencies. In particular, the bits tended to be inefficient since they required a relatively large current to manipulate the magnetic polarization of the bit's free layer. Consequently, adjunct technologies were implemented to mitigate these deficiencies. For example, spin-transfer torque MRAM (STT-MRAM) is a variant of the base MRAM technology whereby the magnetizing current constitutes spin-aligned electrons that are used to directly torque the domains. Additionally, Thermal Assisted Switching MRAM (TAS-MRAM) is yet another variant of MRAM technology whereby the MTJs are heated during the write phase; the heating of the MTJs reduces the current required to polarize the free layer.

Nonetheless, in spite of these advances to MRAM technology and in spite of the many potential advantages that MRAM technology offers, it has yet to be made to be commercially viable. Accordingly, there exists a need to develop more effective electromagnetic configurations that implement magnetoresistance principles such that they can be made to be more commercially viable.

SUMMARY OF THE INVENTION

Systems and methods in accordance with embodiments of the invention implement DIOMEJ cells that include a diode arranged in series with a magnetoelectric junction (MEJ). In one embodiment, a DIOMEJ cell includes: a magnetoelectric junction, that itself includes a ferromagnetic fixed layer, a ferromagnetic, magnetically anisotropic, free layer, and a dielectric layer interposed between said ferromagnetic fixed layer and ferromagnetic, magnetically anisotropic, free layer, where the ferromagnetic fixed layer is magnetically polarized in a first direction, where the ferromagnetic, magnetically anisotropic, free layer has a first easy axis that is substantially aligned with the first direction, such that the ferromagnetic, magnetically anisotropic, free layer can adopt a magnetic polarity that is either parallel with or antiparallel with the first direction, and where the magnetoelectric junction is configured such that when a potential difference is applied across the magnetoelectric junction, the magnetic anisotropy of the ferromagnetic, magnetically anisotropic, free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference; and a diode, where the diode and the magnetoelectric junction are arranged in series.

In another embodiment, the first direction coincides with an in-plane direction.

In yet another embodiment, the first direction coincides with an out-of-plane direction.

In even another embodiment, the coercivity of the ferromagnetic, magnetically anisotropic, free layer is reduced when a potential difference is applied across the magnetoelectric junction.

In still another embodiment, the application of a first threshold potential difference across the ferromagnetic fixed layer and the ferromagnetic, magnetically anisotropic, free layer reduces the coercivity of the ferromagnetic, magnetically anisotropic, free layer to an extent where the strength of the magnetic field imposed by the ferromagnetic fixed layer is sufficient to magnetize the ferromagnetic, magnetically anisotropic, free layer.

In even yet another embodiment, the application of a second threshold potential difference that is greater in magnitude than the first threshold potential difference causes a spin-transfer torque current to flow through the magnetoelectric junction, where the spin-transfer torque current magnetizes the ferromagnetic, magnetically anisotropic, free layer in a direction antiparallel with the first direction.

In a further embodiment, the ferromagnetic fixed layer includes one of: iron, nickel, manganese, cobalt, FeCoB, FeGaB, FePd, and FePt.

In a yet further embodiment, the ferromagnetic, magnetically anisotropic, free layer includes one of: iron, nickel, manganese, cobalt, FeCoB, FeGaB, FePd, and FePt.

In an even further embodiment, the dielectric layer comprises one of: MgO and Al2O3.

In a still further embodiment, a DIOMEJ cell further includes an externally applied magnetic field that is either parallel with or antiparallel with the magnetic polarization of the ferromagnetic fixed layer, wherein the externally applied magnetic field has a strength sufficient to magnetize the ferromagnetic, magnetically anisotropic, free layer when its coercivity is reduced with the application of a potential difference across the ferromagnetic fixed layer and the ferromagnetic free layer.

In an even yet further embodiment, a DIOMEJ cell further includes a seed layer.

In another embodiment, the seed layer comprises Tantalum.

In yet another embodiment, a DIOMEJ cell further includes a second dielectric layer and a semi-fixed layer, where the second dielectric layer is interposed between the ferromagnetic, magnetically anisotropic, free layer and the semi-fixed layer; where the semi-fixed layer has a direction of magnetic polarization that is antiparallel with the direction of magnetic polarization of the ferromagnetic fixed layer; and where, when a potential difference is applied across the magnetoelectric junction, the magnetic anisotropy of the semi-fixed layer is altered such that the relative strength of the magnetic anisotropy along a third easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of a potential difference; where the extent of this alteration is less than that of the ferromagnetic, magnetically anisotropic, free layer.

In even another embodiment, the application of a potential difference pulse that has a duration that coincides with half of the precessional period of the ferromagnetic, magnetically anisotropic, free layer, or an odd multiple thereof, inverts the direction of magnetic polarization of the magnetoelectric junction.

In a further embodiment, a magneto-electric random access memory, includes: an array of DIOMEJ cells; where each DIOMEJ cell includes: a magnetoelectric junction, that itself includes: a ferromagnetic fixed layer; a ferromagnetic, magnetically anisotropic, free layer; and a dielectric layer interposed between said ferromagnetic fixed layer and ferromagnetic, magnetically anisotropic, free layer; where the ferromagnetic fixed layer is magnetically polarized in a first direction; where the ferromagnetic, magnetically anisotropic, free layer has a first easy axis that is substantially aligned with the first direction, such that the ferromagnetic, magnetically anisotropic, free layer can adopt a magnetic polarity that is either parallel with or antiparallel with the first direction; and where the magnetoelectric junction is configured such that when a potential difference is applied across the magnetoelectric junction, the magnetic anisotropy of the ferromagnetic, magnetically anisotropic, free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference; and a diode; where the diode and the magnetoelectric junction are arranged in series; a plurality of source lines; and a plurality of bit lines; where each DIOMEJ cell is electrically connected to a unique combination of a source line and a bit line, such that no other DIOMEJ cell is connected to the same bit line and the same source line; and where a source line and a bit line can be used to establish a potential difference across a particular DIOMEJ cell.

In a yet further embodiment, for at least one DIOMEJ cell, the first direction coincides with an in-plane direction.

In a still yet further embodiment, for at least one DIOMEJ cell, the first direction coincides with an out-of-plane direction.

In an even further embodiment, for at least one DIOMEJ cell, the application of a first threshold potential difference across the ferromagnetic fixed layer and the ferromagnetic, magnetically anisotropic, free layer reduces the coercivity of the ferromagnetic, magnetically anisotropic, free layer to an extent where the strength of the magnetic field imposed by the ferromagnetic fixed layer is sufficient to magnetize the ferromagnetic, magnetically anisotropic, free layer.

In an even yet further embodiment, for the at least one DIOMEJ cell, the application of a second threshold potential difference that is greater in magnitude than the first threshold potential difference causes a spin-transfer torque current to flow through the magnetoelectric junction that magnetizes the ferromagnetic, magnetically anisotropic, free layer in a direction antiparallel with the first direction.

In a still even yet further embodiment, for at least one DIOMEJ cell, the coercivity of the ferromagnetic, magnetically anisotropic, free layer is reduced when a potential difference is applied across the magnetoelectric junction.

In another embodiment, for at least one DIOMEJ cell, the application of a potential difference pulse that has a duration that coincides with half of the precessional period of the ferromagnetic, magnetically anisotropic, free layer, or an odd multiple thereof, inverts the direction of magnetic polarization of the magnetoelectric junction.

DETAILED DESCRIPTION

Figure 1:
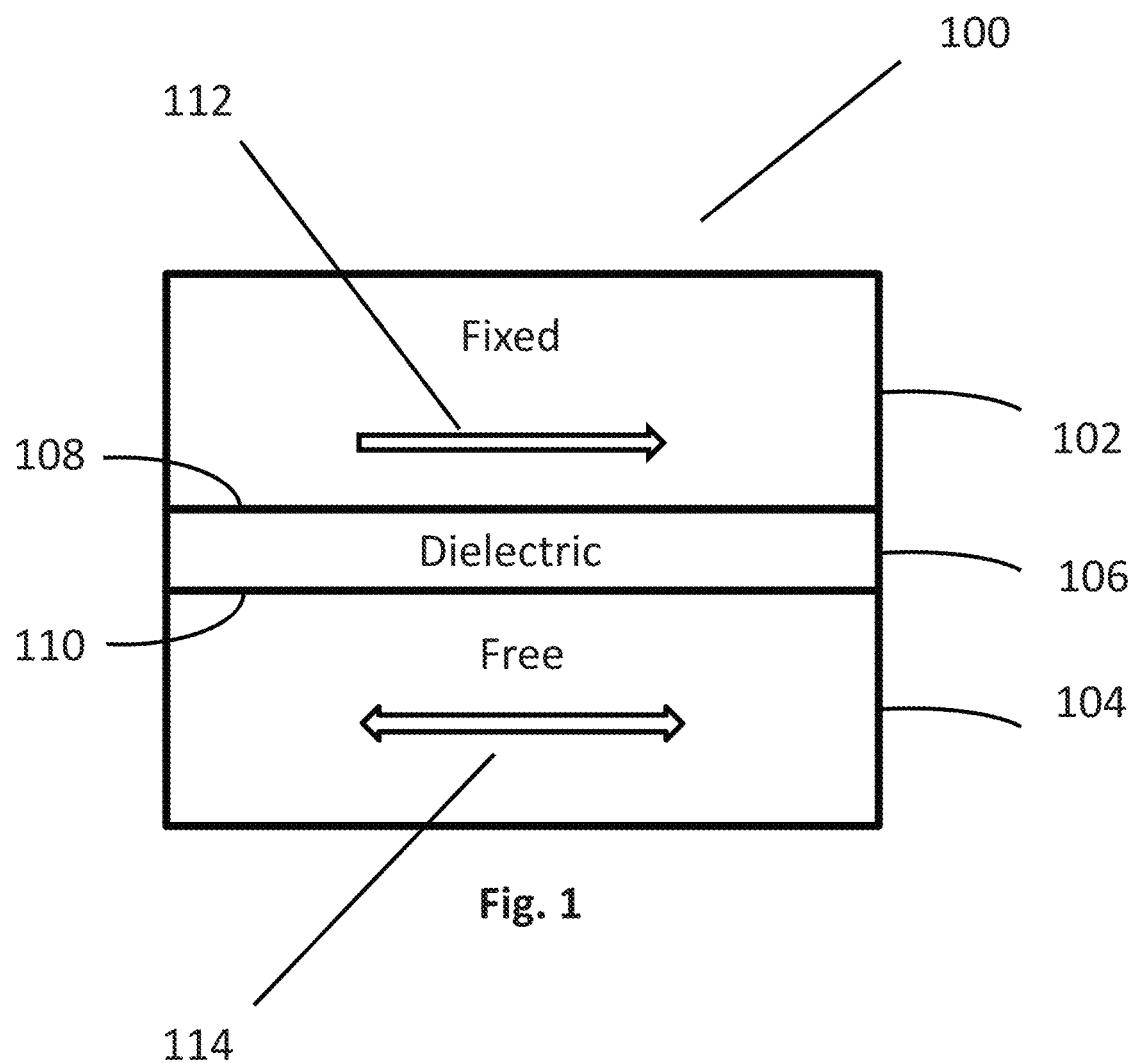
FIG. 1 illustrates an MEJ that includes in-plane anisotropies in accordance with embodiments of the invention.

Turning now to the drawings, systems and methods for implementing DIOMEJ cells that include a magnetoelectric junction arranged in series with a diode are illustrated. Previous efforts at implementing electromagnetic components that utilize magnetoresistance phenomena to achieve two information states (i.e. one bit of information), e.g. MTJs, were largely directed at using a current to produce a magnetic field to manipulate the device. However, the currents required were often considerable, e.g., in cases where MTJs were used in MRAM configurations. Indeed, in applications that require low-power operation, the requirement of a considerable current made the implementation of devices that rely on MTJs less commercially viable. Accordingly, voltage-controlled magnetic anisotropy-based MTJs (VMTJs) that generally allow MTJs to utilize an electric field to facilitate the imposition of a magnetic polarization onto the free layer as opposed to (or in some cases, in addition to) using a current to do so were developed and reported. See e.g., International Patent Application Number PCT/US2012/038693, International Publication Number WO 2012/159078 A2, entitled "Voltage-Controlled Magnetic Anisotropy (VCMA) Switch and Magneto-electric Memory (MERAM)," by Khalili Amiri et al., the disclosure of which is herein incorporated by reference. It has been demonstrated that such devices result in marked performance improvements over conventional MTJs. In the instant application, the term 'magnetoelectric junction' (MEJ) is used to refer to devices that use Voltage-Controlled Magnetic Anisotropy (VCMA) principles to help them realize two distinct information states, e.g. voltage-controlled magnetic anisotropy-based MTJs (VMTJs) as well as the VCMA switches disclosed in International Patent Application Number PCT/US2012/038693, cited above. In many instances, an MEJ includes a ferromagnetic fixed layer, a ferromagnetic, magnetically anisotropic, free layer, and a dielectric layer interposed between said ferromagnetic fixed layer and ferromagnetic, magnetically anisotropic, free layer. The ferromagnetic fixed layer has a fixed magnetic polarization, whereas the ferromagnetic, magnetically anisotropic, free layer can be magnetized such that it has a polarization either parallel with or antiparallel with the ferromagnetic fixed magnet. In many instances, the application of a potential difference across the MEJ, allows the free layer to be magnetized in a desired direction; the free layer can thereby be magnetized either parallel with or antiparallel with the polarity of the fixed magnet. In accordance with magnetoresistance principles, the resistance of the MEJ will vary depending upon whether the free layer adopts a parallel magnetic polarization or an antiparallel magnetic polarization, and therefore, the MEJ can define two information states (i.e. one bit of information). Thus, MEJs can utilize VCMA principles to help them achieve two distinct information states.

Conventional devices that rely on magnetoresistance principles for operation typically utilize transistors as access devices, e.g. to supply current. Transistors have been used, in part, because of their ability to supply current of opposing polarities, which has been required to write different bits of information in many conventional devices. However, transistors are typically relatively bulky. Accordingly, systems and methods in accordance with embodiments of the instant invention implement configurations whereby voltages of a single polarity can be used to alter the logic state of an MEJ, such that a diode, which can be less bulky than a transistor, can be used as the MEJ's access device; a configuration that includes such an MEJ with a diode acting as an access device is referred to as a DIOMEJ cell. The utilization of diodes, as opposed to transistors, as an access device can confer many advantages. For instance, as can be inferred, DIOMEJ cells can be more densely arranged than MEJ-transistor components. Thus, in an 'MRAM' type array of MEJ bits, i.e. magnetoelectric RAM (MeRAM), where a crossbar arrangement is implemented, the implementation of DIOMEJ cells can allow for the 3D stacking of crossbars, thereby increasing the bit density of the MeRAM configuration. Such a configuration is more viable when using DIOMEJ cells as opposed to MEJ-transistor components. Moreover, using diodes as the access device, can eliminate or reduce undesirable sneak currents that are typically present in traditional crossbar arrays.

Accordingly, in many embodiments of the invention, a DIOMEJ cell includes: a magnetoelectric junction, that itself includes a ferromagnetic fixed layer, a ferromagnetic, magnetically anisotropic, free layer, and a dielectric layer interposed between said ferromagnetic fixed layer and ferromagnetic, magnetically anisotropic, free layer, where the ferromagnetic fixed layer is magnetically polarized in a first direction, where the ferromagnetic, magnetically anisotropic, free layer has a first easy axis that is substantially aligned with the first direction, such that the ferromagnetic, magnetically anisotropic, free layer can adopt a magnetic polarity that is either parallel with or antiparallel with the first direction, and where the magnetoelectric junction is configured such that when a potential difference is applied across the magnetoelectric junction, the magnetic anisotropy of the ferromagnetic, magnetically anisotropic, free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference; and a diode, where the diode and the magnetoelectric junction are arranged in series. The MEJ structure is now discussed in greater detail.

Structures for Magnetoelectric Junctions

In many embodiments of the invention, a DIOMEJ cell includes a magnetoelectric junction (MEJ). Any suitable MEJ can be used—for example, any of the MEJs disclosed in International Patent Application Number PCT/US2012/038693, cited above, can be implemented. In many embodiments, the MEJ includes a ferromagnetic (FM) fixed layer, an FM, magnetically anisotropic, free layer (for simplicity, the terms "FM, magnetically anisotropic, free layer" and "FM free layer" will be considered equivalent throughout this application, unless otherwise stated), and a dielectric layer separating the FM fixed layer and FM free layer. Generally, the FM fixed layer has a fixed magnetic polarization, i.e. the direction of magnetic polarization of the FM fixed layer does not change during the operation of the MEJ. Conversely the FM free layer can be magnetized such that it has a polarization either parallel with or antiparallel with the FM fixed layer, i.e. during the normal operation of the MEJ, the direction of magnetization can be made to change. For example, the FM free layer may have a magnetic anisotropy, whereby it has an easy axis that is substantially aligned with the direction of magnetic polarization of the FM fixed layer. The easy axis refers to the axis, along which, there is a tendency for the layer to magnetize. In other words, an easy axis is an energetically favorable direction (axis) of spontaneous magnetization that is determined by the sources of magnetic anisotropy listed below. Relatedly, an easy plane is a plane whereby the direction of magnetization is favored to be within the plane, although there is no bias toward a particular axis within the plane. The easy axis and the direction of magnetic polarization are considered to be 'substantially aligned' when the polarization of the FM free layer can be made to be at least partially parallel or antiparallel to the direction of magnetic polarization of the FM fixed layer to the extent that the principles of magnetoresistance occur and result in a distinct measurable difference in the resistance of the MEJ as between when the magnetic polarizations of the FM layers are parallel relative to when they are antiparallel, e.g. such that two distinct information states can be defined.

The principles of voltage-controlled magnetic anisotropy (VCMA) can be relied on in switching the FM free layer's characteristic magnetic polarization, i.e. the application of a potential difference between the FM fixed layer and the FM free layer generally augments the FM free layer's direction of magnetic anisotropy, and relatedly reduces its coercivity. Accordingly, with a reduced coercivity, the FM free layer can be subject to magnetization that can make it parallel with or antiparallel with the direction of magnetic polarization for the FM fixed layer. A more involved discussion regarding the general operating principles of an MEJ is presented in the following section.

Notably, the direction of magnetic polarization, and the related characteristics of magnetic anisotropy, can be established for the FM fixed and FM free layers using any suitable method. For instance, the shapes of the constituent FM fixed layer, FM free layer, and dielectric layer, can be selected based on desired magnetic polarization orientations. For example, implementing FM fixed, FM free, and dielectric layers that have an elongated shape, e.g. have an elliptical cross-section, may tend to induce magnetic anisotropy that is in the direction of the length of the elongated member—i.e. the FM fixed and FM free layers will possess a tendency to be magnetized in the direction along the length of the elongated member. In other words, the direction of the magnetic polarization is 'in-plane'. Alternatively, where it is desired that the magnetic anisotropy have a directional component that is perpendicular to the FM fixed and FM free layers (i.e., 'out-of-plane'), the shape of the layers can be made to be symmetrical, e.g. circular, and further the FM layers can be made to be thin. In this case, while the tendency of the magnetization to remain in-plane may still exist, it may not have a preferred directionality with in the plane of the layer, and thus the layer may define an easy plane insofar as there is an anisotropic tendency within the plane of the layer although there is no preferred axis of magnetization within the plane. Where the FM layers are relatively thinner, the anisotropic effects that result from interfaces between the FM layers and any adjacent layers, which tend to be out-of-plane, may tend to dominate the overall anisotropy of the FM layer. Alternatively, a material may be used for the FM fixed or free layers which has a bulk perpendicular anisotropy, i.e. an anisotropy originating from its bulk (volume) rather than from its interfaces. The FM free or fixed layers may also consist of a number of sub-layers, with the interfacial anisotropy between individual sub-layers giving rise to an effective bulk anisotropy to the material as a whole. Alternatively, FM free or fixed layers may be constructed which combine these effects, and for example have both interfacial and bulk contributions to perpendicular anisotropy.

FIG. 1 illustrates an MEJ whereby the FM fixed layer and the FM free layer are separated by, and directly adjoined to, a dielectric layer. In particular, in the illustrated embodiment, the MEJ 100 includes an FM fixed layer 102 that is adjoined to a dielectric layer 106, thereby forming a first interface 108; the MEJ further includes an FM free layer 104 that is adjoined to the dielectric layer 106 on an opposing side of the first interface 108, and thereby forms a second interface 110. The MEJ 100 has an FM fixed layer 102 that has a magnetic polarization 112 that is in-plane, and depicted in the illustration as being from left to right. Accordingly, the FM free layer is configured such that it can adopt a magnetic polarization 114 that is either parallel with or antiparallel with the magnetic polarization of the FM fixed layer. Additional contacts (capping or seed materials, or multilayers of materials, not shown) may be attached to the FM free layer 104 and the FM fixed layer 102, thereby forming additional interfaces. The contacts both contribute to the electrical and magnetic characteristics of the device by providing additional interfaces, and can also be used to apply a potential difference across the device. Additionally, it should of course be understood that MEJs can include metallic contacts that can allow them to interconnect with other electrical components.

Importantly, by appropriately selecting the materials, the MEJ can be configured such that the application of a potential difference across the FM fixed layer and the FM free layer can modify the magnetic anisotropy of the FM free layer. For example, whereas in FIG. 1, the magnetic anisotropy of the FM free layer is depicted as being in-plane, the application of a voltage may distort the magnetic anisotropy of the FM free layer such that it includes a component that is at least partially out of plane. The particular dynamics of the modification of the magnetic anisotropy will be discussed below in the section entitled "MEJ Operating Principles." Suitable materials for the FM layers such that this effect can be implemented include iron, nickel, manganese, cobalt, FeCoB, FeGaB, FePd, and FePt; further, any compounds or alloys that include these materials may also be suitable. Suitable materials for the dielectric layer include MgO and $Al_2O_3$. Of course, it should be understood that the material selection is not limited to those recited—any suitable FM material can be used for the FM fixed and free layers, and any suitable material can be used for the dielectric layer in accordance with embodiments of the invention. It should also be understood that each of the FM free layer, FM fixed layer, and dielectric layer may consist of a number of sub-layers, which acting together provide the functionality of the respective layer.

Figure 2:
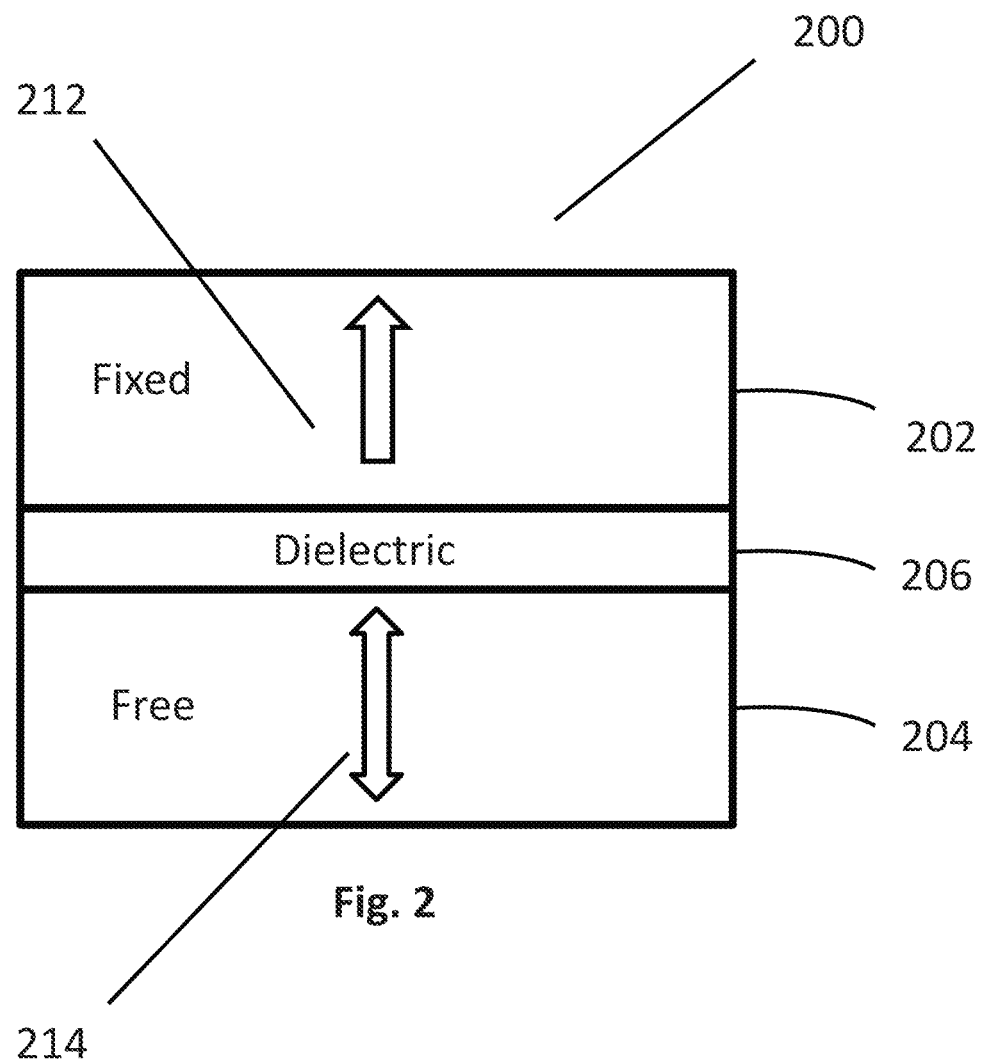
FIG. 2 illustrates an MEJ that includes out-of-plane anisotropies in accordance with embodiments of the invention.

FIG. 2 illustrates an MEJ whereby the orientation of the magnetic polarizations is perpendicular to the plane of the constituent layers. In particular, the MEJ 200 is similarly configured to that seen in FIG. 1, with an FM fixed layer 202 and an FM free layer 204 adjoined to a dielectric layer 206. However, unlike the MEJ in FIG. 1, the magnetic polarizations of the FM fixed and FM free layers, 212 and 214 respectively, are oriented perpendicularly to the layers of the MEJ. Additional contacts (capping or seed materials, or multilayers of materials, not shown) may be attached to the FM free layer 204 and the FM fixed layer 202, thereby forming additional interfaces. The contacts both contribute to the electrical and magnetic characteristics of the device by providing additional interfaces, and can also be used to apply a potential difference across the device. It should also be understood that each of the FM free layer, FM fixed layer, and dielectric layer may consist of a number of sub-layers, which acting together provide the functionality of the respective layer.

Of course, it should be understood that the direction of magnetic polarization for the FM layers can be in any direction in accordance with embodiments of the invention, as long as the FM free layer can adopt a direction of magnetic polarization that is either parallel with or antiparallel with the direction of magnetic polarization of the FM fixed layer, or contains a polarization component that is either parallel or anti-parallel with the direction of magnetic polarization of the FM fixed layer. For example, the direction of magnetic polarization can include both in-plane and out-of-plane components.

Indeed, it has been observed that where the in-plane and out-of-plane anisotropies are relatively similar, thereby resulting in an overall anisotropy that has anisotropic components in-plane and out-of-plane, an MEJ is most sensitive to VCMA principles and can thereby be advantageous.

In many embodiments, an MEJ includes, in addition to an FM fixed layer, an FM free layer, and a dielectric layer, additional adjunct layers that function to facilitate the operation of the MEJ. For example, in many embodiments, the FM free layer includes a capping or seed layer, which can help induce greater electron spin perpendicular to the surface of the layer and/or can enhance the sensitivity to the application of a potential difference.

Figure 3:
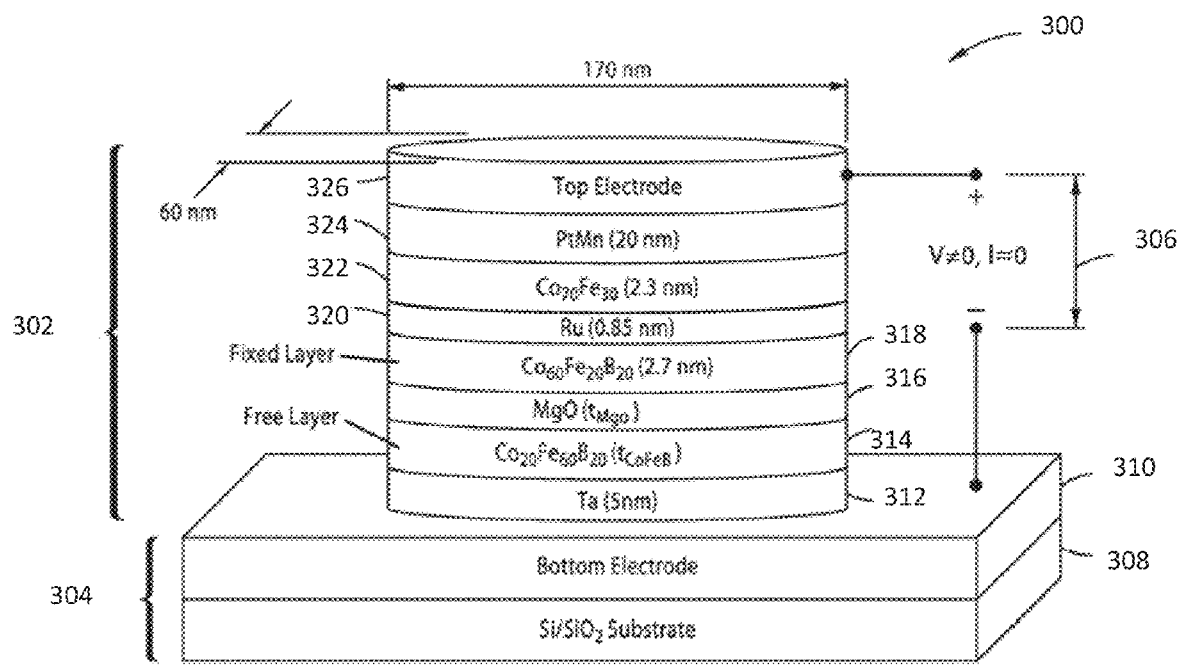
FIG. 3 illustrates an MEJ that includes adjunct layers to facilitate its operation in accordance with embodiments of the invention.

FIG. 3 illustrates an MEJ 300 that includes multiple layers that work in aggregate to facilitate the functionality of the MEJ 300. A pillar section 302 extends from a planar section 304. A voltage is shown being applied 306 between the top and bottom of the pillar. By way of example, an Si/SiO2 substrate 308 is seen over which is a bottom electrode 310. The pillar 302 comprises the following layers in order: Ta 312 (e.g., 5 nm in thickness); a free layer 314 preferably comprising an Fe-rich CoFeB material (e.g. $Co_{20}Fe_{60}B_{20}$ having a thickness generally ranging from, but not limited to, 0.8 nm-1.6 nm); a dielectric layer 316 comprising a dielectric oxide such as MgO or $Al_2O_3$ having a thickness of approximately, but not limited to, 0.8-1.4 nm); a FM fixed layer 318 preferably comprising a Cobalt-rich CoFeB material (e.g. $Co_{60}Fe_{20}B_{20}$ having a thickness of approximately, but not limited to, 2.7 nm); a metal layer (e.g. Ru 320 having a thickness of approximately, but not limited to, 0.85 nm) to provide antiferromagnetic inter-layer exchange coupling; an exchange-biased layer 322 of $Co_{70}Fe_{30}$ (e.g., thickness of approximately, but not limited to, 2.3 nm), the magnetization orientation of which is pinned by exchange bias using an anti-ferromagnetic layer 324, e.g. PtMn, IrMn, or a like material having a thickness of approximately, but not limited to, 20 nm); and a top electrode 326. By way of example and not limitation, the pillar of the device depicted is in the shape of a 170 nm×60 nm elliptical nanopillar. In this illustration, Ta layer 312 is used as a seed layer to help induce a larger magnitude of electron spin and/or enhance the electric-field sensitivity of magnetic properties (such as anisotropy) in the FM free layer. It also acts as a sink of B atoms during annealing of the material stack after deposition, resulting in better crystallization of the FM free layer and thereby increasing the TMR effect. Of course any suitable materials can be used as a capping or seed layer 312; for example, materials based on Ruthenium, hafnium, and palladium, may be used. More generally, any adjunct layers that can help facilitate the proper functioning of the MEJ can be implemented in accordance with embodiments of the invention.

In numerous embodiments, the MEJ includes a semi-fixed layer which has a magnetic anisotropy that is altered by the application of a potential difference. In many instances the characteristic magnetic anisotropy of the semi-fixed layer is a function of the applied voltage. For example in many cases, the direction of the orientation of the magnetic anisotropy of the semi-fixed layer is oriented in the plane of the layer in the absence of a potential difference across the MEJ. However, when a potential difference is applied, the magnetic anisotropy is altered such that it includes a strengthened out-of-plane anisotropy. Moreover, the extent to which the magnetic anisotropy of the semi-fixed layer is modified as a function of applied voltage can be made to be less than the extent to which the magnetic anisotropy of the FM free layer is modified as a function of applied voltage. The incorporation of a semi-fixed layer can facilitate a more nuanced operation of the MEJ (to be discussed below).

Figure 4A:
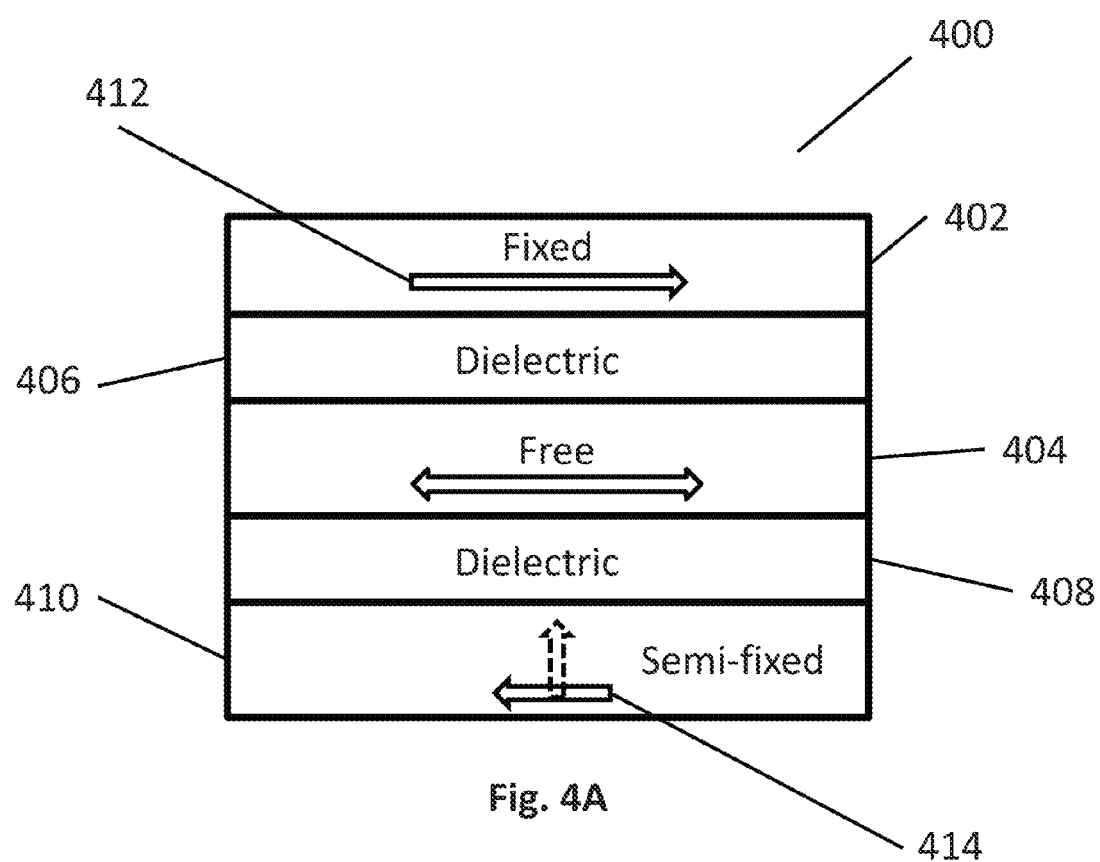
FIGS. 4A and 4B illustrate MEJs that include a semi-fixed layer in accordance with embodiments of the invention.
Figure 4B:
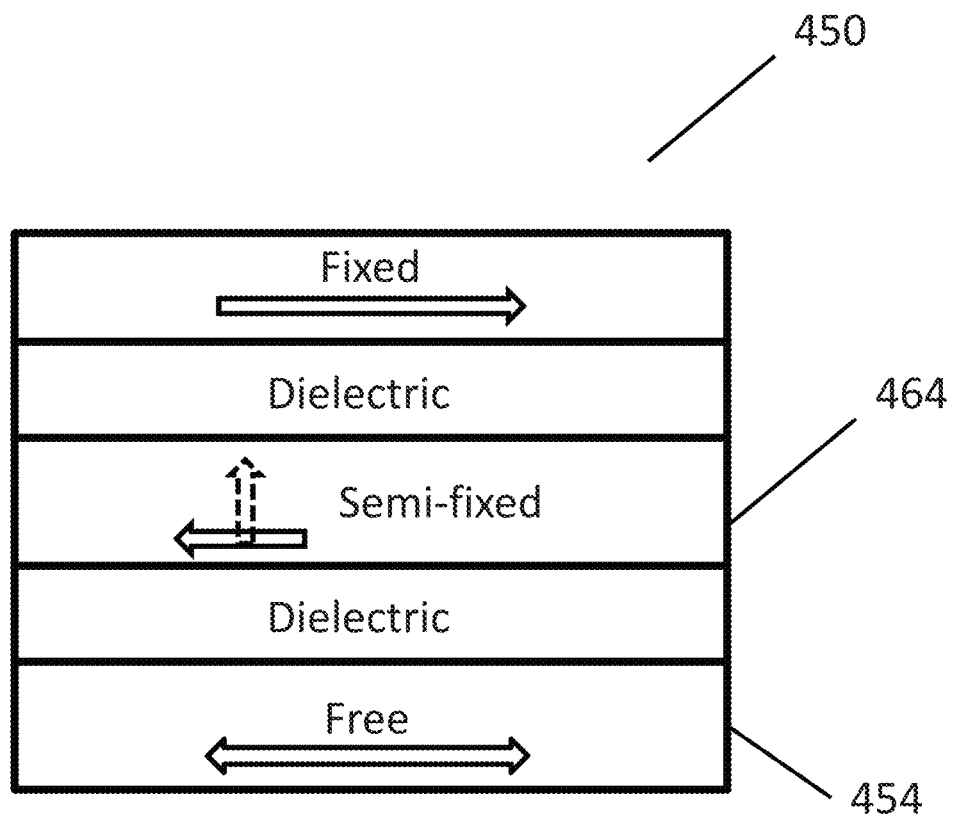

FIG. 4 illustrates an MEJ that includes a semi-fixed layer. In particular, the configuration of the MEJ 400 is similar to that depicted in FIG. 1, insofar as it includes an FM fixed layer 402 and an FM free layer 404 separated by a dielectric layer 406. However, the MEJ 400 further includes a second dielectric layer 408 adjoined to the FM free layer 404 such that the FM free layer is adjoined to two dielectric layers, 406 and 408 respectively, on opposing sides. Further, a semi-fixed layer 410 is adjoined to the dielectric layer. Typically, the direction of magnetic polarization of the semi-fixed layer 414 is anti-parallel with that of the FM fixed layer 412. As mentioned above, the direction of magnetic polarization of the semi-fixed layer can be manipulated based on the application of a voltage. In the illustrated embodiment, it is depicted that the application of a potential difference adjusts the magnetic anisotropy of the semi-fixed layer such that the strength of the magnetic anisotropy along a direction orthogonal to the initial direction of magnetization polarization is developed. Note that in the illustrated embodiment, the directions of magnetic polarizations are all depicted to be in-plane where there is no potential difference. However, of course it should be understood that the direction of the magnetic polarization can be in any suitable direction in accordance with embodiments of the invention. More generally, although a particular configuration of an MEJ that includes a semi-fixed layer is depicted, it should of course be understood that a semi-fixed layer can be incorporated within an MEJ in any number of configurations in accordance with embodiments of the invention. For example, FIG. 4B illustrates an MEJ that includes a semi-fixed layer that is in a different configuration than that seen in 4A. In particular, the MEJ 450 is similar to that seen in FIG. 4A, except that the positioning of the semi-fixed layer 464 and the free layer 454 is inverted. In certain situations, such a configuration may be more desirable.

Indeed, although several depictions of particular MEJs suitable for implementation within a DIOMEJ cell have been described, it should of course be understood that any of a variety of MEJ cells can be incorporated within a DIOMEJ cell in accordance with embodiments of the invention. For example, any suitable MEJ disclosed in International Patent Application Number PCT/US2012/038693, cited above, can be implemented The general operation of an MEJ is now discussed.

General Principles of MEJ Operation

In numerous embodiments, MEJs are utilized in DIOMEJ cells based upon their operating principles. MEJs generally function to achieve two distinct information states using the principles of magnetoresistance. As mentioned above, magnetoresistance principles regard how the resistance of a thin film structure that includes alternating layers of ferromagnetic and non-magnetic layers depends upon whether the ferromagnetic layers are in a parallel or antiparallel alignment. Thus, an MEJ can achieve a first information state where its FM layers have magnetic polarizations that are parallel, and a second information state where its FM layers have magnetic polarizations that are antiparallel. MEJs further rely on the principles of voltage controlled magnetic anisotropy (VCMA). Generally, VCMA principles regard how the application of a potential difference across a ferromagnetic material that is adjoined to a dielectric layer can impact the characteristics of its magnetic anisotropy. For example, it has been demonstrated that the interface of oxides such as MgO with metallic ferromagnets such as Fe and CoFeB can exhibit a large perpendicular magnetic anisotropy which is furthermore sensitive to voltages applied across the dielectric layer, an effect that has been attributed to spin-dependent charge screening and to the electric field induced modulation of the relative occupancy of atomic orbitals at the interface. In any case, based on these principles, MEJs can achieve two distinct information states. Generally, MEJs can employ two mechanisms to do so: first, MEJs can be configured such that the application of a potential difference across the MEJ functions to reduce the coercivity of the FM free layer, such that it can be subject to magnetization in a desired polar direction, i.e. either parallel with or antiparallel with the polarization direction of the fixed layer; second, MEJ operation can rely on precessional switching (or resonant switching), whereby by precisely subjecting the MEJ to voltage pulses of precise widths, the direction of magnetic polarization of the FM free layer can be made to switch.

In many embodiments, MEJ operation is based on reducing the coercivity of the FM free layer such that it can be magnetized in a desired direction. With a reduced coercivity, the FM free layer can be magnetized in any suitable way in accordance with embodiments of the invention. For instance, the magnetization can result from an externally applied magnetic field, the magnetization field resulting from the FM fixed layer, the application of a spin-transfer torque (STT) current, the magnetization field resulting from a FM semi-fixed layer, any combination of these mechanisms, or any suitable method of magnetizing the FM free layer with a reduced coercivity.

By way of example and not limitation, examples of suitable ranges for the externally applied magnetic field are in the range of 0 to 100 Oe, with preferred embodiments working without an externally applied field. The magnitude of the electric field applied across the device to reduce its coercivity or bring about resonant switching can be approximately in the range of 0.1-2.0 V/nm, with lower electric fields required for materials combinations that exhibit a larger VCMA effect. The magnitude of the STT current used to assist the switching may be in the range of approximately 0.1-1.0 MA/cm$^2$.

Figure 5A:
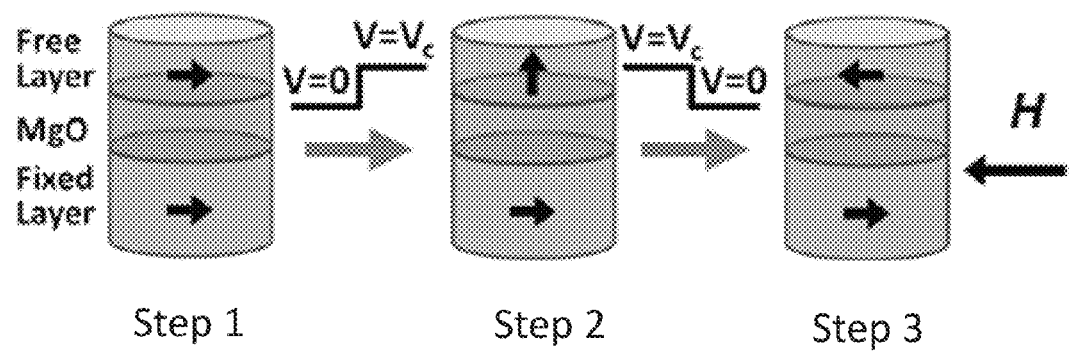
FIGS. 5A and 5B illustrate the operation of an MEJ in accordance with embodiments of the invention.

FIG. 5A depicts how the application of a potential difference can reduce the coercivity of the free layer such that it can be magnetized by an externally applied magnetic field H. In the illustrated embodiment, in step 1, the FM free layer and the FM fixed layer have a magnetic polarization that is substantially in plane; the FM free layer is magnetized in a direction that is parallel with that of the FM fixed layer. Further, in Step 1, the coercivity of the FM free layer is such that the FM free layer is not prone to having its direction of magnetic polarization reversed by the magnetic field H, which is in a direction antiparallel with the polarization direction of the FM fixed layer. However, a Voltage, $V_c$ is then applied, which results in step 2, where the voltage $V_c$ has modified the magnetic anisotropy of the free layer such that the strength of the magnetic anisotropy along an easy axis that is orthogonal to the initial easy axis is magnified. Correspondingly, the coercivity of the FM free layer is reduced such that it is subject to magnetization by an in-plane magnetic field H. Accordingly, when the potential difference $V_c$ is removed, VCMA effects are removed and the magnetic field H magnetizes the FM free layer in a direction that is antiparallel with the polarization of the FM fixed layer. Hence, as the MEJ now includes an FM fixed layer and an FM free layer that have magnetic polarizations that are antiparallel, it reads out a second information state (resistance value) different from the first. Thus, it can be seen that by controlling the potential difference and the direction of an applied magnetization, an MEJ switch can be achieved.

Figure 5B:
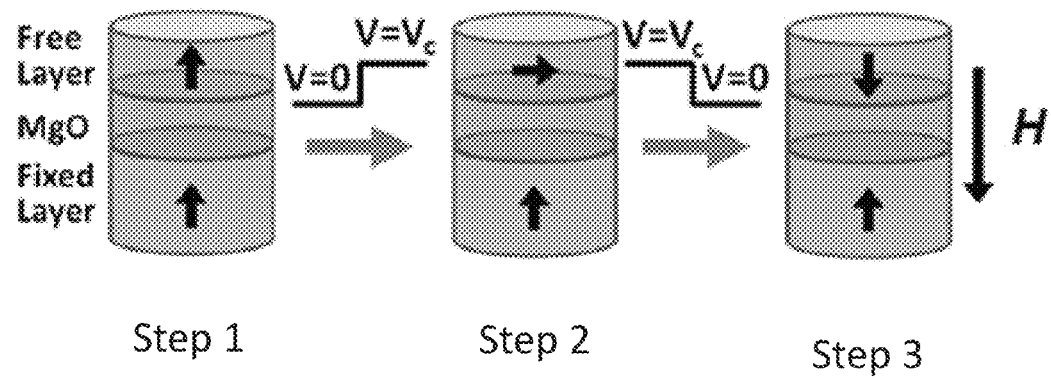

It should of course be understood that the direction of the FM fixed layer's magnetic polarization need not be in-plane—it can be in any suitable direction in accordance with embodiments of the invention. For instance, it can be substantially out of plane. Additionally, the FM free layer can include magnetic anisotropies that are both in-plane and out-of-plane; indeed, in many instances, it has been observed that the coercivity is most sensitive to the application of voltage when the in-plane anisotropy and out-of-plane anisotropy are of relatively similar strengths. FIG. 5B depicts a corresponding case relative to FIG. 5A when the FM fixed and FM free layers have directions of magnetic polarization that are perpendicular to the layers of the MEJ (out-of-plane). It is of course important, that an FM, magnetically anisotropic, free layer be able to adopt a magnetic polarization direction that is either substantially parallel with an FM fixed layer, or substantially antiparallel with an FM fixed layer. In other words, when unburdened by a potential difference, the easy axis of the FM free layer should be aligned with the direction of magnetic polarization, such that the FM free layer can adopt a direction of polarization that is either parallel with or antiparallel with the direction of the FM fixed layer's polarization, to the extent that a distinct measurable difference in the resistance of the MEJ that results from the principles of magnetoresistance as between the two states (i.e. parallel alignment vs. antiparallel alignment) can be measured, such that two distinct information states can be defined.

Note of course that the application of an externally applied magnetic field is not the only way for the MEJ to take advantage of reduced coercivity upon application of a potential difference. For example, in many embodiments, the magnetic polarization of the FM fixed layer is used to magnetize the free layer when it has a reduced coercivity. Moreover, in a number of embodiments, an MEJ is configured to receive a spin-transfer torque (STT) current when application of a voltage causes a reduction in the coercivity of the FM free layer. Generally, STT current is a spin-polarized current that can be used to magnetize a magnetizable layer. Accordingly, the STT current can then magnetize the FM free layer, where the direction of the spin determines the direction of magnetization. This configuration is advantageous over conventional STT-RAM configurations since the reduced coercivity of the FM free layer reduces the amount of current required to magnetize the FM free layer, thereby making the device more energy efficient.

Additionally, in many embodiments, the MEJ cell further takes advantage of thermally assisted switching (TAS) principles. Generally, in accordance with TAS principles, heating up the MEJ during a writing process reduces the magnetic field required to induce switching. Thus, for instance, where STT is employed, even less current may be required to magnetize a free layer, particularly where VCMA principles have been utilized to reduce its coercivity.

Moreover, the switching of MEJs to achieve two information states can also be achieved using voltage pulses. In particular, if voltage pulses are imposed on the MEJ for a time period that is one-half of the precession of the magnetization of the free layer, then the magnetization may invert its polarity. Using this technique, ultrafast switching times, e.g. below 1 ns, can be realized; moreover, using voltage pulses as opposed to a current, makes this technique more energetically efficient as compared to the precessional switching induced by STT currents, as is often used in STT-RAM. However, this technique is subject to the application of a precise pulse that is half the length of the precessional period of the magnetization layer. For instance, it has been observed that pulse durations in the range of 0.05 to 3 nanoseconds can reverse the magnetic polarization. Additionally, the voltage pulse must be of suitable amplitude to cause the desired effect, e.g. reverse the direction of magnetic polarization.

With these principles in mind, the unipolar operation of MEJs is now discussed.

Unipolar MEJ Operation

In many embodiments, the MEJ is configured so that a voltage of a single polarity can allow the MEJ to adopt either of the two specified information states. This can be achieved using any of a number of configurations. For example, an STT current can be used in conjunction with an applied magnetic field to allow an MEJ to switch information states using voltages of a single polarity. For example, in some embodiments, the MEJ is subject to a biasing magnetic field. When the MEJ is subject to a potential difference, $V_1$, the coercivity of the FM free layer is reduced, such that the biasing magnetic field can magnetize the FM free layer in the biased direction. This aspect of the operation is similar to that depicted in FIGS. 5A and 5B. However, when the MEJ is further subject to an increased voltage $V_2$ (i.e., increased in magnitude), the coercivity is further reduced; at this greater potential difference, current-induced effects become important. In particular, the greater voltage induces a current that can be made to be an STT current and thereby magnetize the free layer. The direction of polarization that the STT current induces can be antiparallel with that of the magnetic field. Thus, at a voltage $V_2$, the induced STT current plays a more prominent role in magnetizing the FM free layer and does so. Ultimately, at a voltage $V_1$, the biasing field determines the magnetization of the free layer; whereas, at a voltage $V_2$, the STT current determines the magnetization of the free layer. Accordingly, each of two distinct information states can be established using voltages of a single polarity.

In many embodiments, an external biasing magnetic field is not relied upon in this configuration; instead the magnetic field imposed by the FM fixed layer is used to establish direction of polarization at the lower voltage $V_1$.

In some embodiments, MEJs further include a semi-fixed layer that has a magnetic anisotropy that can be altered by the application of a potential difference, e.g., as depicted in FIG. 4. Thus, in many embodiments, when a relatively low voltage $V_1$, is applied to the MEJ that includes a semi-fixed layer, the magnitude of the voltage is not sufficiently strong to noticeably impact the magnetic anisotropy of the semi-fixed layer. Accordingly, the semi-fixed layer still impacts the overall magnetic field. However, when a relatively greater voltage $V_2$ that exceeds the threshold voltage required to noticeably alter the magnetic anisotropy of the semi-fixed layer is applied to the MEJ, the effect of the magnetic polarization of the semi-fixed layer on the overall magnetic field is mitigated or reduced. Accordingly, this phenomenon can be exploited to achieve an MEJ that can achieve two information states using voltages of a single polarity. For example, in many embodiments, where a relatively lower voltage, $V_1$, is applied, the coercivity of the free layer is reduced making it susceptible to magnetization, and the semi-fixed layer plays a dominant role in magnetizing the free layer. However, when a relatively higher voltage, $V_2$, is applied, the magnetizing ability of the semi-fixed layer is mitigated, and the fixed layer plays a dominant role in establishing the polarization of the free layer. Of course, as before, an externally applied biasing magnetic field can be implemented consistent with these principles.

Although several examples are provided for achieving unipolar operation of an MEJ, any number of configurations can be implemented for unipolar operation of an MEJ, in accordance with embodiments of the invention. For example, in a number of embodiments, a voltage of a single polarity is used to reduce the coercivity of the FM free layer, and either of two different magnetic fields, oriented either parallel with or anti parallel with, a respective FM fixed layer are used to write to the MEJ and define information states. Thus, the above-described examples for realizing unipolar operation are meant to be illustrative and not comprehensive.

Importantly, where voltages of a single polarity are used to write to the MEJ, then a diode may be used as an access device and coupled to the MEJ to form a DIOMEJ cell. The arrangement of a DIOMEJ cell is now discussed below.

Diomej Cell

Figure 6:
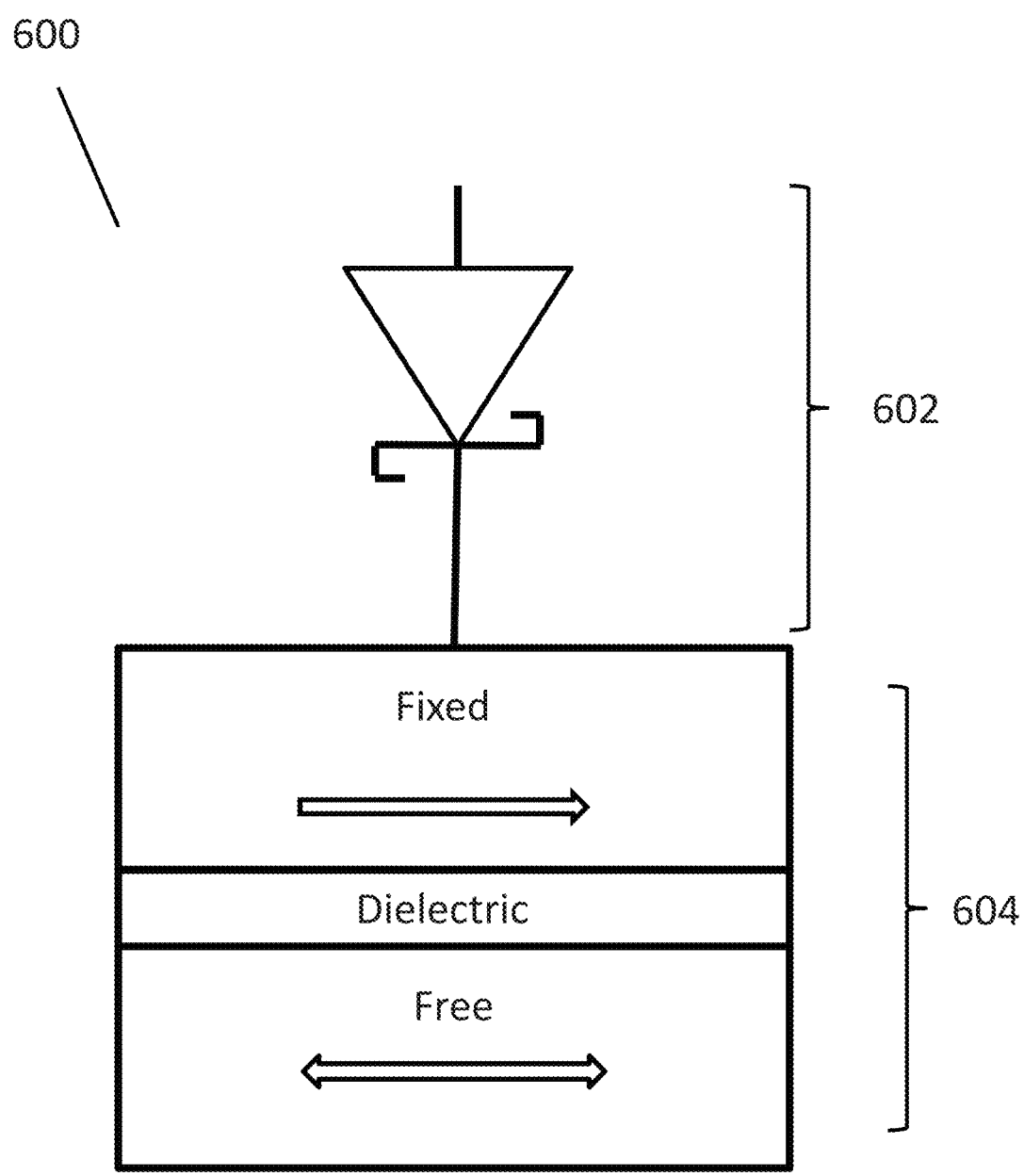
FIG. 6 illustrates a DIOMEJ cell that incorporates a Schottky diode in accordance with embodiments of the invention.

In many embodiments, a DIOMEJ cell is realized by coupling a diode to a MEJ cell and using the diode as an access device. In particular, whereas conventionally MEJ cells utilize transistors as access devices, using a diode can confer many advantages. In particular, diodes can be made to conform to a smaller form factor. Accordingly, a DIOMEJ cell can be made to be more densely packed as compared to a MEJ—transistor configuration. Moreover, the implementation of a diode can reduce the occurrences of sneak currents. Diodes can be coupled to an MEJ in any suitable fashion, and any suitable diode may be used. For example, FIG. 6 depicts a DIOMEJ that incorporates a Schottky diode. In particular, in the illustrated embodiment, a DIOMEJ cell, 600, includes a Schottky diode, 602, that is coupled to the FM fixed layer of an MEJ 604. The metal-semiconductor interface junction region creates a Schottky diode barrier that has properties of a diode, but the switching speed is generally fast, such as in the picoseconds range, and the forward voltage drop is relatively small, such as from 0.1 to 0.4 Volts. Of course, although a DIOMEJ cell incorporating a Schottky diode is illustrated, any suitable diode can be implemented in a DIOMEJ cell in accordance with embodiments of the invention. For example, a zener diode, an avalanche diode, and a tunnel diode, can be incorporated in a DIOMEJ cell in accordance with embodiments of the invention.

Figure 7:
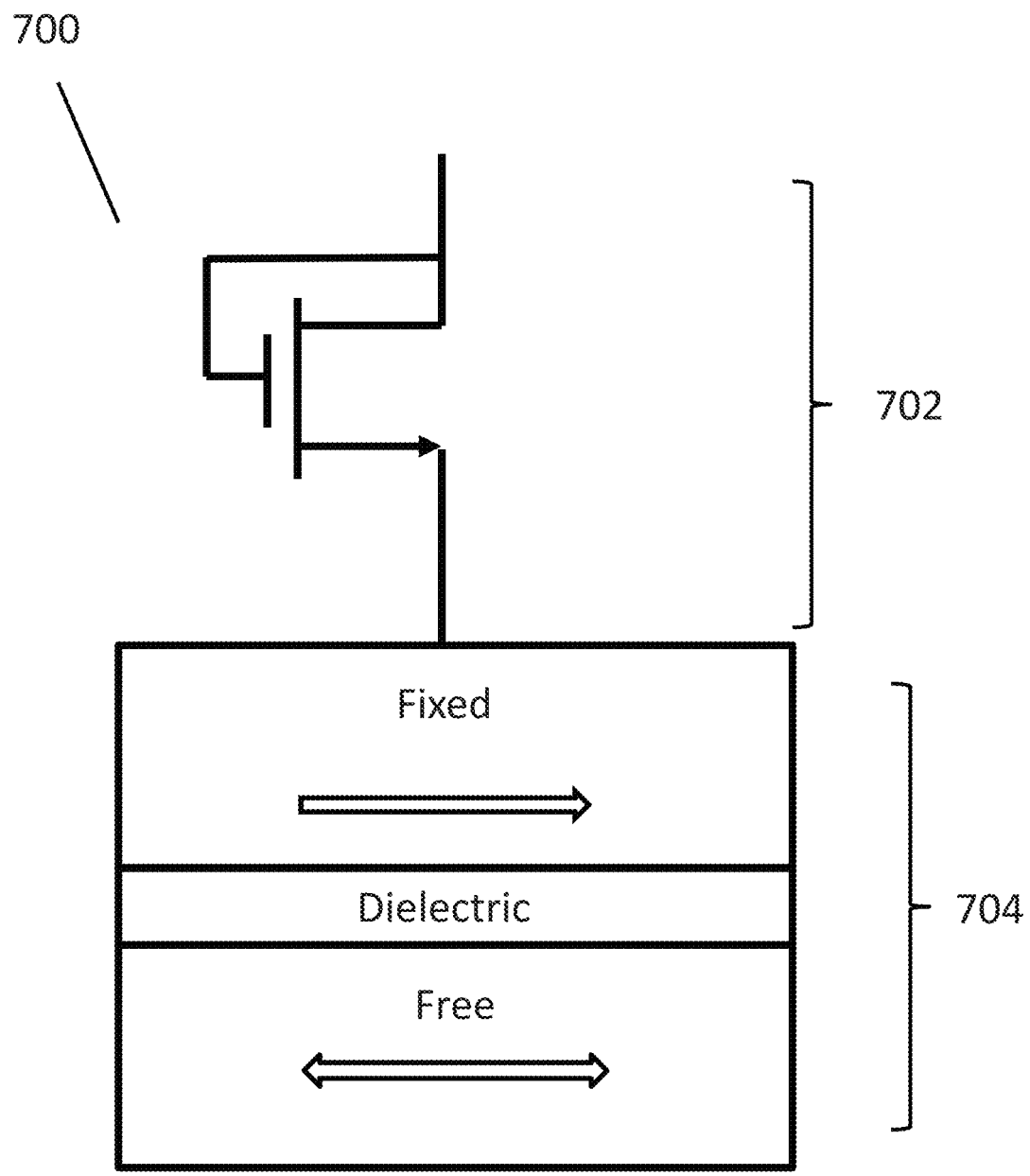
FIG. 7 illustrates a DIOMEJ cell that incorporates a diode-type device in accordance with embodiments of the invention.

Moreover, a 'diode-type' device may be coupled to an MEJ to form a DIOMEJ cell. For example, FIG. 7 depicts a DIOMEJ cell that includes a 'diode-type' device. In particular, the DIOMEJ 700 includes a diode-connected transistor 702 that is coupled to the FM fixed layer of an MEJ 704. The utilization of a diode-connected transistor can offer more flexibility. For example, when transistor 702 is a NMOS, its width and length sizes are often adjustable to yield a particular resistance value when it is in the OFF state and a lower value when it is in the ON state. As a diode-connected NMOS 702, the gate and drain of NMOS 702 are electrically connected together, and the source node of NMOS 702 is electrically connected in series to the MEJ. Alternatively, transistor 702 is a diode-connected PMOS transistor, a bipolar or a JFET device, and so on. As a diode-connected PMOS, the drain node of transistor 702 is electrically connected in series to the MEJ.

Figure 8:
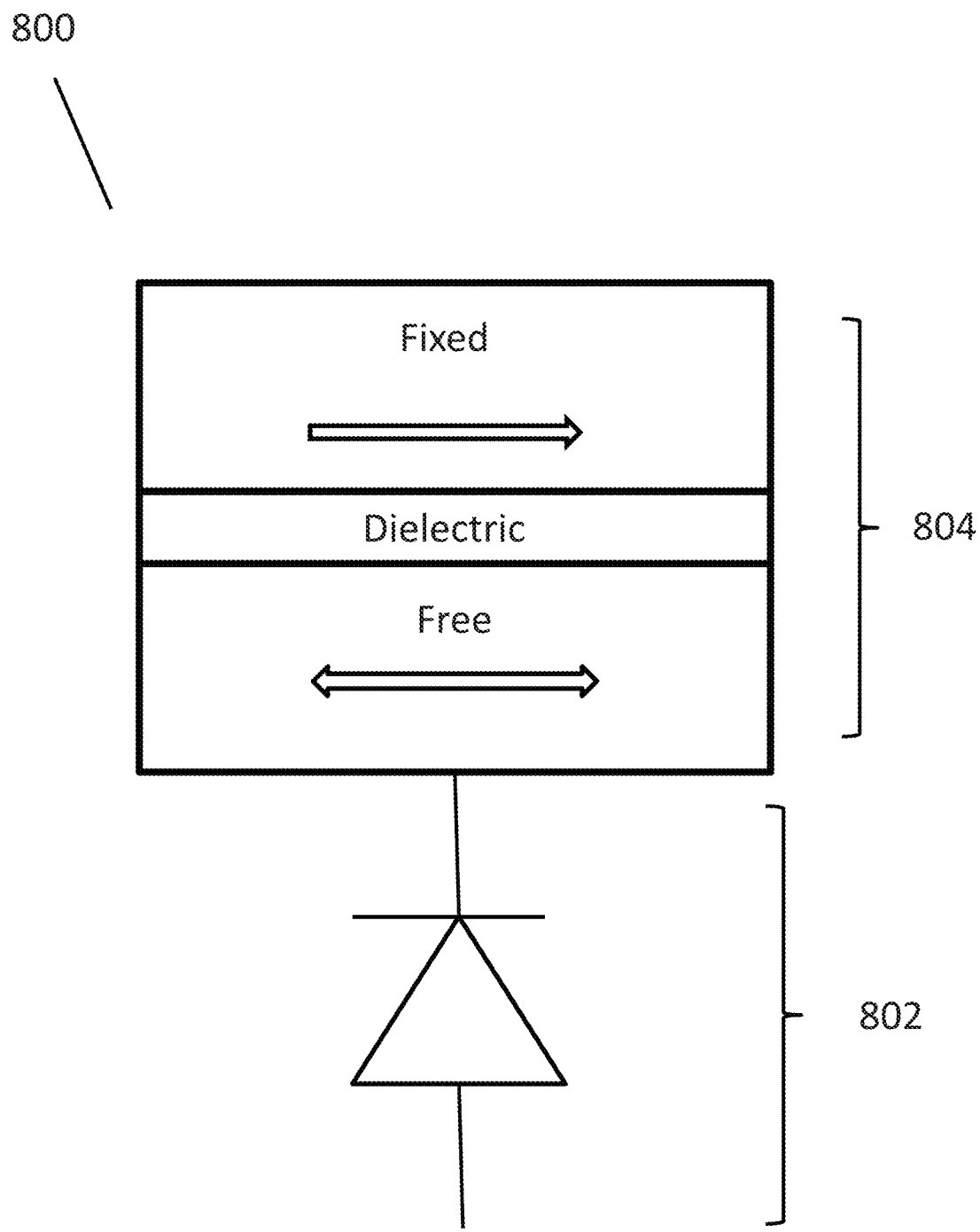
FIG. 8 illustrates a DIOMEJ cell where the diode is in electrical contact with the free layer of an MEJ in accordance with embodiments of the invention.

Of course, it should be understood that it is not requisite that a diode or diode-type device be connected to the FM fixed layer of an MEJ; indeed, in many embodiments, a DIOMEJ cell includes a diode electrically coupled to a FM free layer of an MEJ. FIG. 8 illustrates a DIOMEJ cell, 800, where a diode 802 is electrically coupled to the free layer of an MEJ 804. Any suitable way of electrically coupling a diode to an MEJ such that it can act as an access device may be implemented in accordance with embodiments of the invention.

Figure 9:
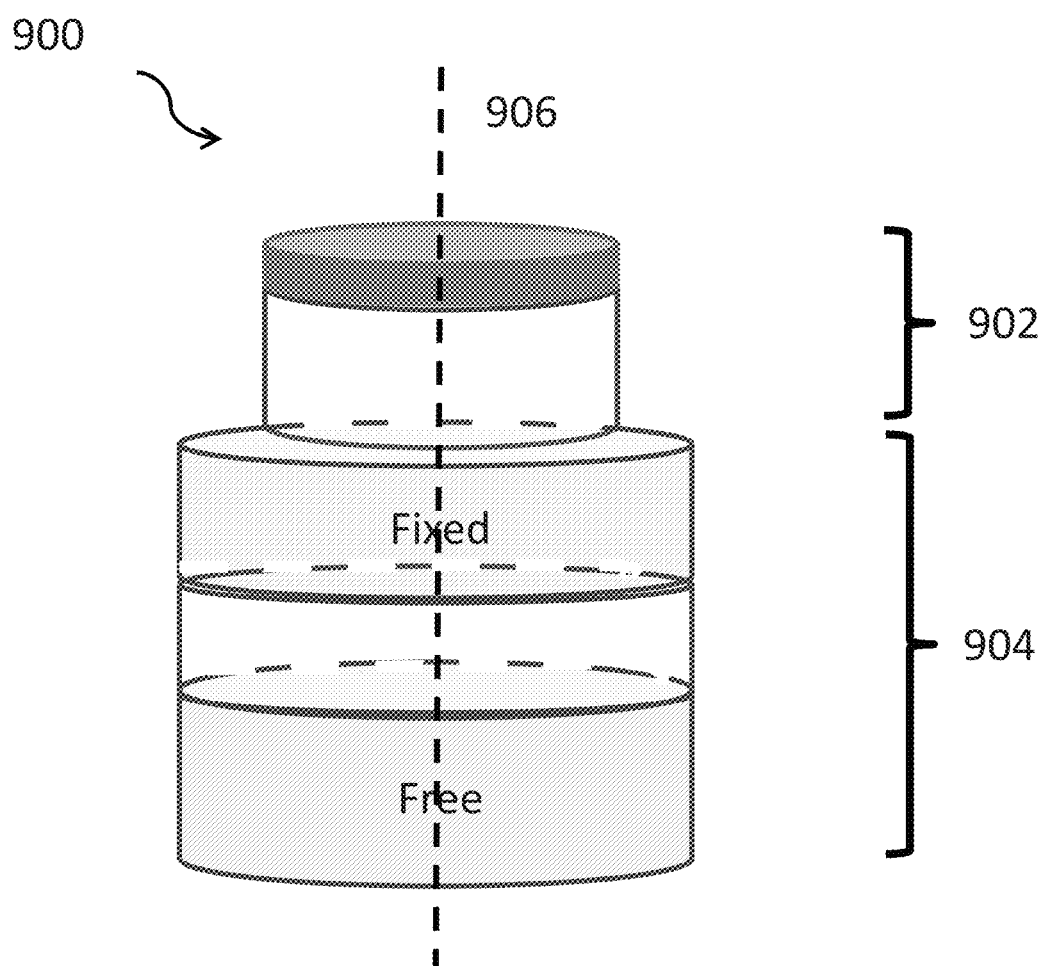
FIG. 9 illustrates a 3D schematic of a DIOMEJ cell in accordance with embodiments of the invention.

Although not drawn to scale, FIG. 9 provides a 3D schematic of a DIOMEJ cell. In particular, the DIOMEJ cell 900 includes a diode 902 in electrical communication with an MEJ 904. Interconnect contacts between diode 902 and MEJ 904 are not shown and in some embodiments there is no interconnect, stub, via, contact, wire or electrode, altogether, if a layer of the MEJ 904 serves dual purposes, for both electrical interconnection and for performing its expected magnetizing abilities. In the illustrated embodiment, diode 902 and MEJ 904 are both generally cylindrical and may share the same central axis 906. The dimensions of the configuration can vary. For example, in many embodiments, the overall vertical dimension is in the range of 20 nm-100 nm for the diode 902, and 20 nm-70 nm for MEJ 904. In a number of embodiments, the diameter for diode 902 is typically in the range of 10 nm-150 nm and for MEJ 904 is 10 nm-180 nm. In an embodiment where it is desirable to increase the OFF state resistance of the diode, its diameter should be reduced and/or its vertical length should be increased. Also, when a DIOMEJ cell 900 is part of an array of DIOMEJ cells, the center-to-center spacing between adjacent DIOMEJ cells 900 are typically on the order of 20 nm to 2000 nm, and are determined by the desired array density and layout rules for the given manufacturing technology. Moreover, in many embodiments, there is insulating material such as oxide or nitride between adjacent DIOMEJ cells 900. Although specific dimensions have been recited, it should of course be realized that DIOMEJ cells can be implemented in a variety of dimensions in accordance with embodiments of the invention, and the dimensions are not limited to the recitations.

Figure 10:
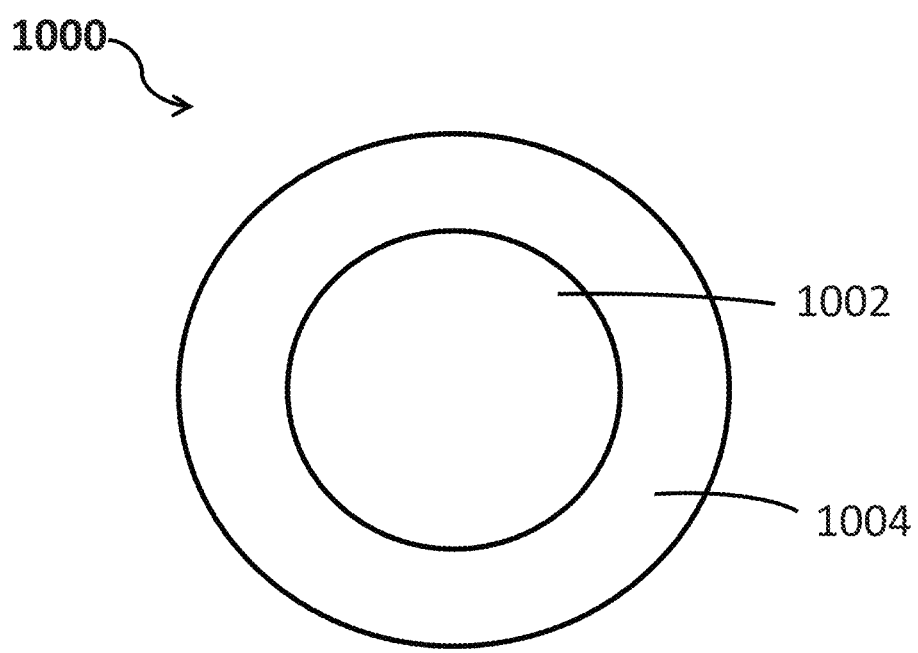
FIG. 10 illustrates a DIOMEJ cell that has a circular cross-sectional shape in accordance with embodiments of the invention.

Although FIG. 9 depicts a generally cylindrical or pillar-shaped (or nanopillars) DIOMEJ cell 900, other geometries are possible, depending on the application, on the packing density of the DIOMEJ cell, or on the manufacturing tool capability available. For example, FIG. 10 depicts a circular top view of the DIOMEJ cell 1000, or a bottom view if the diode 1002 were fabricated before the MEJ 1004. In FIG. 10, the diameter of diode 1002 is smaller than that of MEJ 1004, but alternatively to avoid etch effects, in other embodiments the diameter of the diode 1002 is made comparable to that of MEJ 1004 so that the two cross sectional areas may coincide, or the diode 1002 may be larger.

Figure 11A:
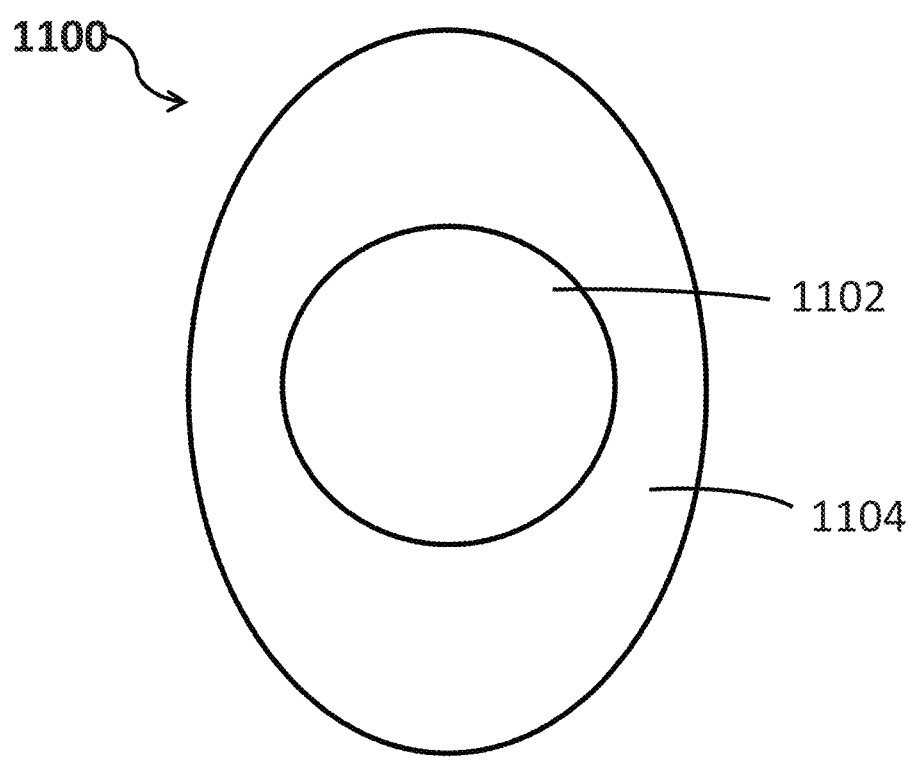
FIGS. 11A-11C illustrate different shapes that a DIOMEJ cell may adopt in accordance with embodiments of the invention.

Moreover, although the cross sectional area of either the diode 1002 or MEJ 1004 is depicted as being substantially circular, other shapes are possible or even desirable based on the circumstances. For example, for in-plane oriented spin operation of an MEJ, an oval or elliptical cross sectional area as shown in FIG. 11A is often more optimal for the MEJ 1104. The ratio of the long diameter to the short diameter is typically in the range of 3.5 to 1.5; but of course, it can be in any suitable range.

Figure 11B:
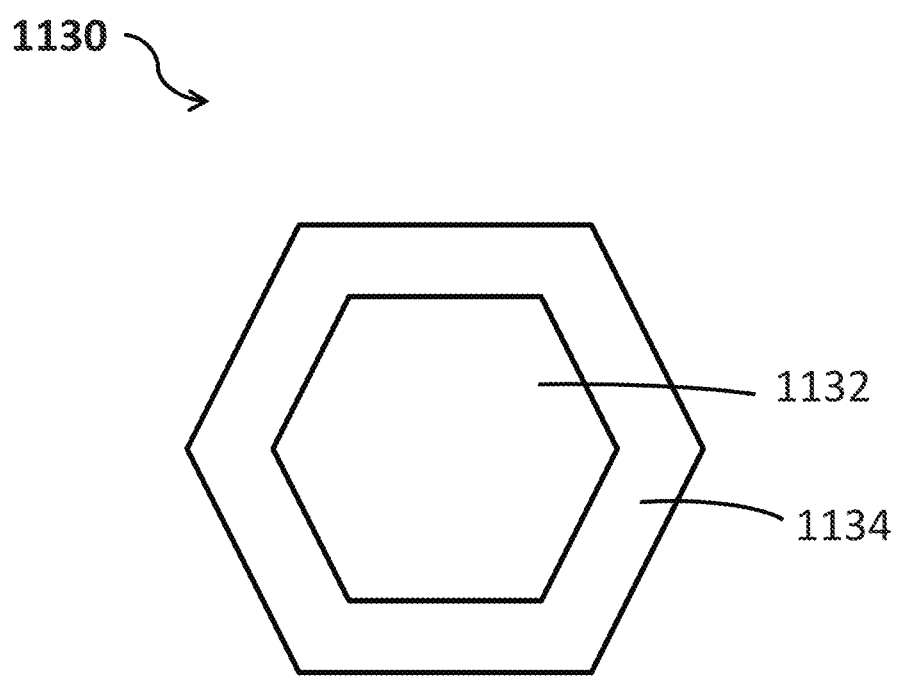
Figure 11C:
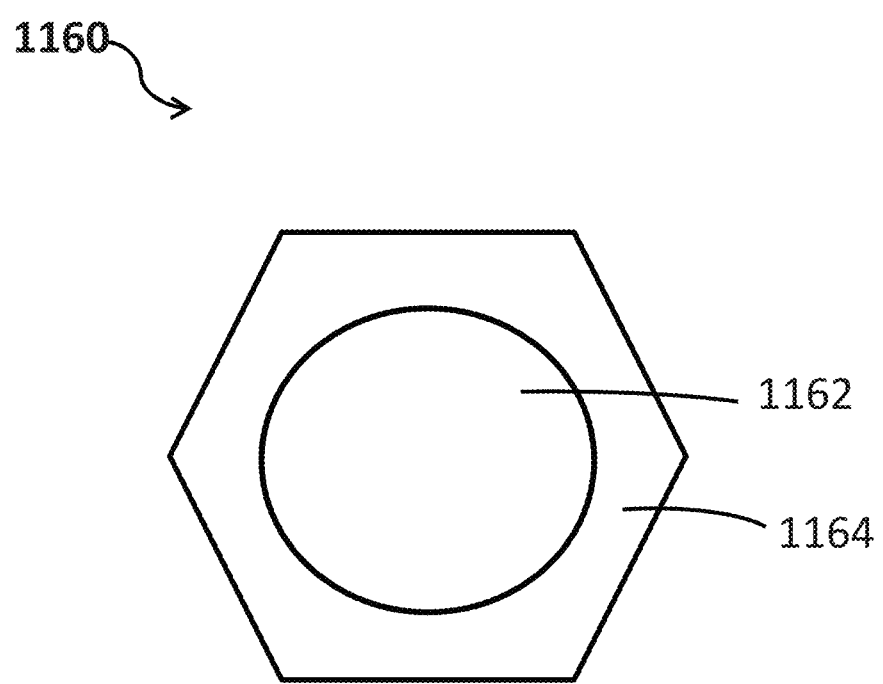

In another embodiment, the cross-sectional areas of both devices are rectangular or substantially square, or with the corners beveled or rounded so that the cross sectional area is hexagonal or octagonal as shown in FIG. 11B. The illustrated embodiment depicts a DIOMEJ cell 1130 including an MEJ 1134 and a diode 1132 that are both hexagonal in shape. Note that beveled or rounded corners may reduce charge congregation, micromagnetic texture, and large local electromagnetic fields. Cross-sectional geometries need not coincide. For example, FIG. 11C depicts a DIOMEJ cell that implements two different cross sections. In particular, the DIOMEJ cell 1160 includes an MEJ 1164 and a diode 1162 that have differing cross sections; specifically, the MEJ 1164 has a hexagonal cross section, while the diode 1162 has a circular cross-section. Note that the geometries can be optimized in consideration of the crystalline structure of the constituent materials. Moreover, the sizes and geometries of MEJ and diode are also further tunable to provide a desired performance property such as resistivity.

Diomej cell applications are discussed below.

Diomej Cell Applications

Because of their form-factor and their energy efficiency, DIOMEJ cells are particularly versatile and can be implemented in a host of applications. For example, DIOMEJ cells can be used as simple switches, incorporated in logic circuits, and used as a fundamental element in a MeRAM configurations.

Figure 12:
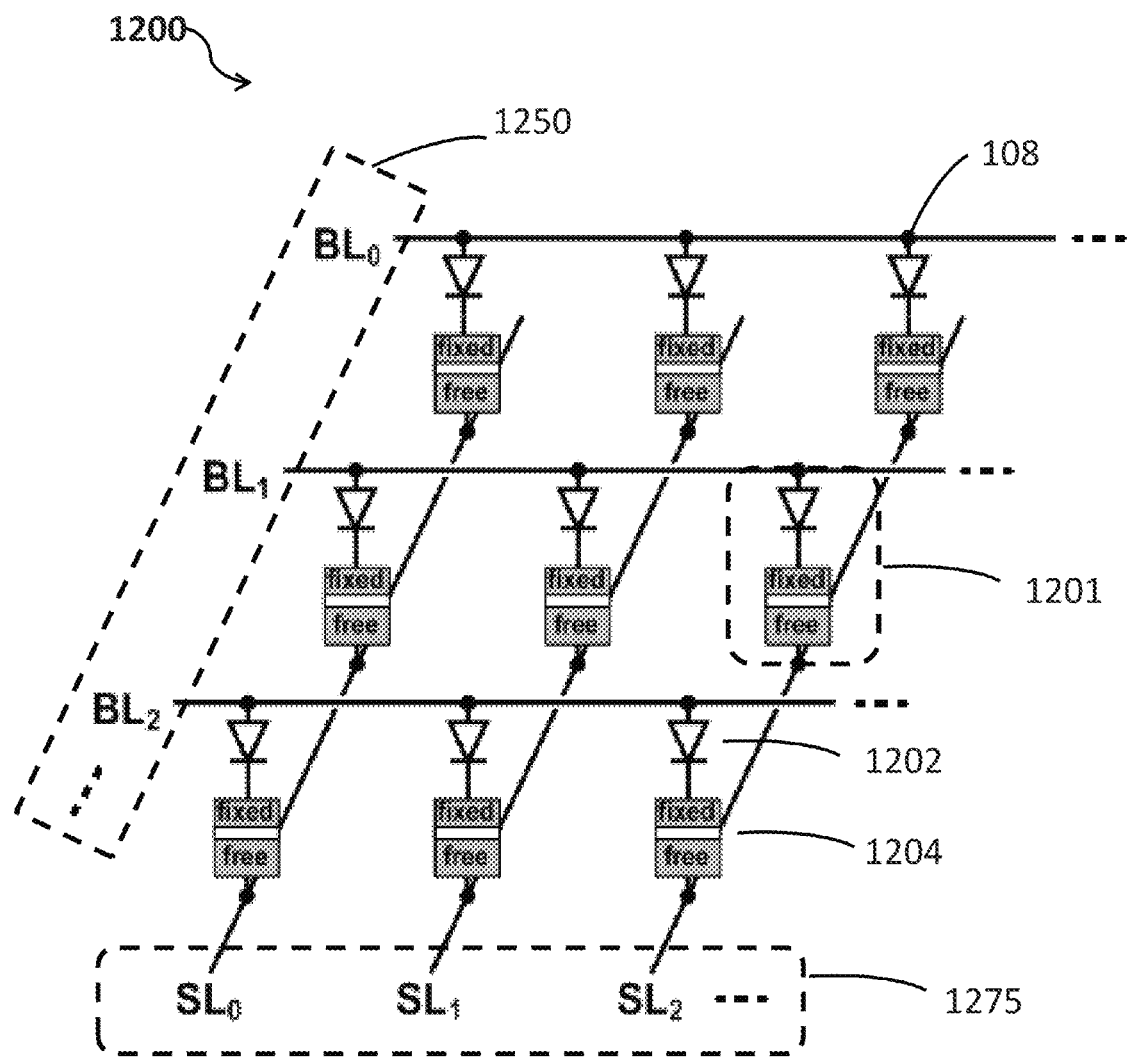
FIG. 12 illustrates a MeRAM configuration that employs DIOMEJ cells in accordance with embodiments of the invention.

FIG. 12 illustrates how DIOMEJ cells can be incorporated in a MeRAM configuration that employs a cross-bar architecture. In particular, the MeRAM crossbar array 1200 includes DIOMEJ cells 1201 that each have an MEJ 1204 and a diode 1202 in electrical communication. The illustration shows a three by three array of DIOMEJ cells 1201, but of course it should be understood that an array of DIOMEJ cells of any size can be implemented in accordance with embodiments of the invention. In the illustrated embodiment, the anode of the diode 1202 is electrically coupled to one of an array of bit lines 1250, while the MEJ 1204 is electrically coupled to one of an array of source lines 1275. Although it should be understood that the MEJ 1204 can be coupled to an array of bit lines, while the anode of the diode can be coupled to one of an array of source lines. Of course, it is understood that the MEJs 1204 are configured for unipolar operation such that the DIOMEJ cells 1201 can function. Accordingly, new bits of information are written to an MEJ 1201 (i.e. information states are established in the MEJ), where a potential difference is established across a respective bit line in the array of bit lines 1250 and a respective source line in the array of source lines 1275. In this configuration, the diode 1202 acts as an access device. The use of diodes as access devices is advantageous insofar as they can prevent parasitic paths that may be present in a MeRAM configuration, and can relatedly improve reading of the DIOMEJ cells since the on/off resistance ratio will be improved. Note also, that the incorporation of diodes, instead of transistors, can allow DIOMEJ cells to be more densely packed, and thereby result in MeRAM with greater capacity.

Figure 13:
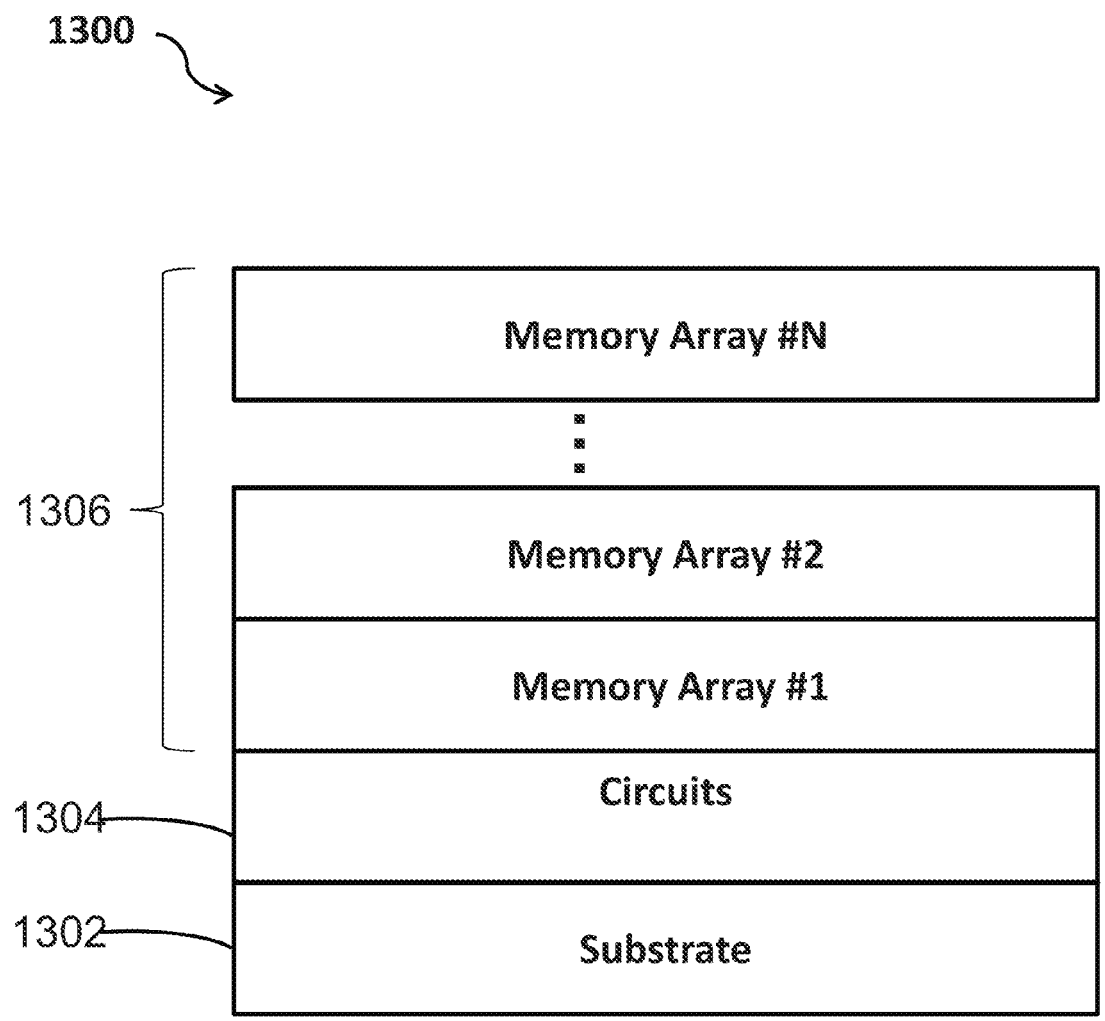
FIG. 13 illustrates a configuration that implements stacked arrays of DIOMEJ cells in accordance with embodiments of the invention.

FIG. 13 depicts a stacked MeRAM configuration. In particular, the MeRAM configuration 1300 includes a substrate 1302, a layer of circuitry deposited on the substrate 1304, and layers of arrays of DIOMEJ cells configured to operate as memory deposited thereon 1306. The substrate layer 1302 simply functions as a structural base layer. The circuitry 1304 can be any circuitry suitable for implementation in a MeRAM configuration, and can include for instance: transistors, address circuits, decode circuits, read and write circuits, logic gates, and sense amplifier circuits to control and operate the cross-bar stacked memory array 1300. The ability to layer arrays of DIOMEJ cells is greatly facilitated by the DIOMEJ cells form-factor, and the layering can allow for a densely packed memory configuration.

Moreover, in many embodiments, MeRAM configurations exploit redundant memory bits that are used to record parity and to enable missing data to be reconstructed by an error-correcting code (ECC). Parity allows the detection of single-bit errors. One common error-correcting code, a SECDED Hamming code, allows a single-bit error to be corrected and, in the usual configuration, with an extra parity bit, double-bit errors to be detected. As DIOMEJ cells can be arranged relatively densely in a MeRAM configuration, the desire to incorporate redundant bits is not as burdensome in these configurations.

Figure 14:
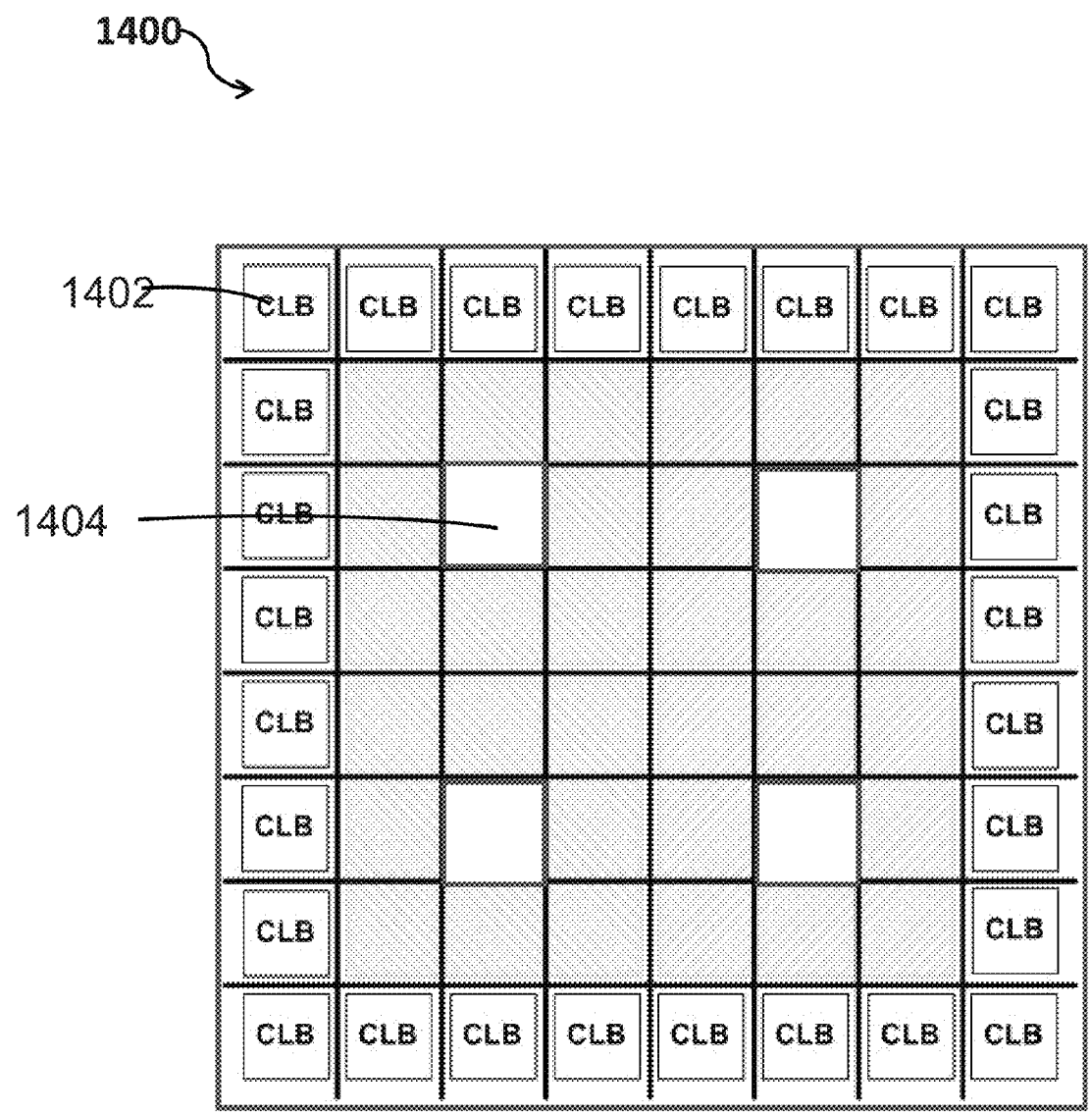
FIG. 14 illustrates a field programmable gate array that includes DIOMEJ cells in accordance with embodiments of the invention.

Diomej cells can also be incorporated in field programmable gate arrays (FPGAs) in accordance with embodiments of the invention. For example, DIOMEJ cells can be implemented in a hybrid FPGA that includes configurable logic blocks and embedded memory, along with other possible functions such as a DSP, floating point units, etc. FIG. 14 illustrates a hybrid FPGA that includes DIOMEJ cells that can be implemented in accordance with embodiments of the invention. In particular, the FPGA 1400 includes configurable logic blocks 1402, and DIOMEJ cells that are configured to act as memory 1404 (e.g. MeRAM configurations, as described above). The logic blocks 1402 can include look up tables that include memory made from the DIOMEJ cross-bar memory arrays or stacked DIOMEJ memory arrays 1404. The embedded memory 1404 is placed and routed together and formed in the center, with the configurable logic blocks 1402 located on the periphery of the embedded memory, 1404. This configuration eases interconnection (electrical wiring or traces) routing between an embedded memory block 1404, and an associated logic block, 1402. Alternatively, to make the capacitive and resistive load of the electric wiring/traces more uniform between each pair of embedded memory block 1404 and associated logic block 1402, the embedded memory blocks 1404 and logic blocks 1402 are interleaved and placed in a checkerboard or island pattern.

Upon startup, the FPGA 1400 is programmed so that its logic blocks 1402 have the needed logic gates to perform certain functions. To ensure security, instead of programming an FPGA from an external source where a bit stream might be monitored and captured by an enemy or competitor or thief, if the embedded memory 1404 is compact and dense enough, multiple bit stream instructions may be stored, one on each embedded memory unit. Then, upon startup it would only be necessary to transmit one code to select an appropriate algorithm that is stored in a particular embedded memory unit to program the FPGA 1400 to perform a particular function. Moreover, the FPGA configuration (i.e. the configuration in the logic blocks 1402) can be readily changed on the fly, while a mission is in transit or in operation, if all the possible algorithms of programming the FPGA 1400 are stored in the embedded memory 1404. This type of application benefits from the non-volatile nature of the DIOMEJ cross-bar memory arrays or stacked arrays. Due to its highly flexible properties, the hybrid FPGA can be used in products for security, communications, data processing, industrial plants and manufacturing, military and aerospace, consumer electronics and the entertainment industry, and automotive. Specific products include mobile phones, tablets, computers, digital cameras, digital audio players, synthesizers, video games, scientific instrumentation, industrial robotics, medical electronics, smart weapons, laser-radars, un-manned air vehicles and so on.

Fabrication

The foregoing discussion highlighted the power efficiency, speed, and non-volatility of DIOMEJ cells and MEJs. These components are further advantageous insofar as they possess favorable manufacturing characteristics. For instance their manufacture can result in a high yield, their manufacture is scalable, and the components are relatively durable (e.g., they don't have intricate geometries) and can be subject to more rigorous manufacturing processes. Their manufacture can be made to be versatile as well. For instance, the manufacture of DIOMEJ cells and MEJs can be adapted for the front end or the back end of the semiconductor line process. For example, a Schottky diode can be formed in the front end of the semiconductor process line's doped semiconductor and metal layers. Fabricating a diode at the front end entails doping the semiconductor crystal by ion implantation, diffusion of dopants, or by epitaxy growth so that there are p-doped and n-doped semiconductors to form a p-n junction. This is especially the case in bipolar, BCD, Bi-CMOS, or Bi-Com (complementary Bi-CMOS) technology. Subsequently, an MEJ can be formed on the back end of the line process. Of course metal and via layers can interconnect the components in a suitable fashion, and the development of these interconnects can occur at any suitable point during the fabrication process.

In many embodiments, entire DIOMEJ cells, and even arrays of DIOMEJ cells, are formed in the back end of a semiconductor process line; thus, the diode is also fabricated in the back end.

Figure 15:
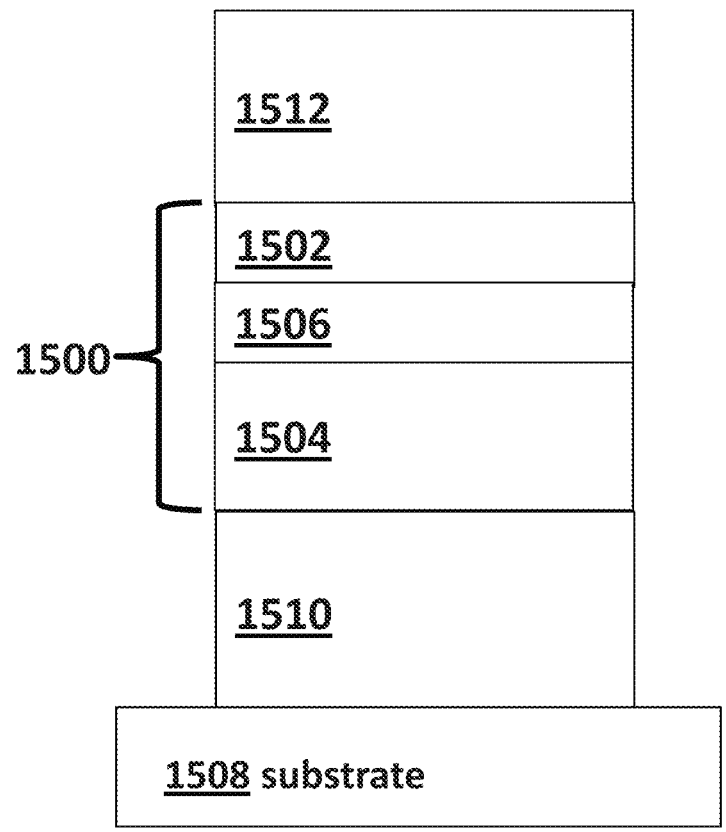
FIG. 15 illustrates the layered deposition of a DIOMEJ cell in accordance with embodiments of the invention.

An exemplary backend method for forming the integrated DIOMEJ cells is illustrated in FIGS. 15-21. FIG. 15 depicts a DIOMEJ cell 1500 on a silicon or silicon dioxide substrate 1508 or other wafer material. Although layer 1508 is labeled "substrate," unless the DIOMEJ cells 1500 are made as standalone objects on bare wafer, there can be transistors, devices, and circuits at that layer 1508, although they are not illustrated. The memory MEJ 1500 includes a fixed ferromagnetic, free ferromagnetic, dielectric, and can include other layers. For example, the layers of the MEJ, 1500, can include Co, Fe, CoFeB, and MgO. In one example, the free layer comprises $Co_{20}Fe_{60}B_{20}$; the dielectric barrier layer comprises MgO; and the fixed layer comprises several layers $Co_{40}Fe_{40}B_{20}$, Ru, $Co_{70}Fe_{30}$, and PtMn. The diode 1502 includes two semiconductor layers, or semiconductor and a metal layer depending on whether it is a P-N junction or a Schottky diode, respectively. For example, the diode 1502 materials include doped silicon, polysilicon, or amorphous silicon. There is an optional metal layer 1506 in between the diode 1502 and MEJ 1504, which together form a DIOMEJ cell 1500. Bottom electrode 1510 and top electrode 1512 allow electrical connection to the DIOMEJ cell 1500. For example the electrodes 1508 and 1512 connect to the rest of the crossbar metallization. The electrodes 1510 and 1512 are likely to be upper level metals because this is a back end of the process example of the method of forming the DIOMEJ cells 1500. The metals include aluminum, copper, tungsten, hafnium, tantalum, thallium, ruthenium, or alloys of these metals, or other materials.

In many embodiments, an MEJ is prepared by depositing continuous multiple layers of films of different material (e.g. CoFeB, MgO, PtMn, IrMn, synthetic anti-ferromagnetic material). For example, the films for the fixed ferromagnetic layers and free ferromagnetic layers are deposited by a physical vapor deposition (PVD) system and subsequently annealed in an in-plane or out-of-plane magnetic field, or without a magnetic field, above 200° C. Annealing may take place under vacuum conditions to avoid oxidation of the material stack. As further example, metallic films are deposited by DC frequency sputtering while the dielectric tunnel layer is deposited by radio-frequency sputtering from a ceramic MgO target, or by dc sputtering of Mg and subsequent oxidation, or by a combination of both. The sputtering is performed by magnetron sputter deposition uniformly on a surface that is held at approximately ambient temperatures. The surfaces of these various layers may be planarized after each layer is formed, and the planarization techniques include chemical-mechanical polishing. The thickness of each layer is in the range of 0.1 to 10 nm, and is designed to achieve certain concentrations of spins or magnetization, resistivity, voltage ranges to flip the spin, and various other electrical performance parameters. For example, the dielectric tunnel layer is designed to be thick enough to make the current-induced spin-transfer torque small. The switching speeds in MEJs are adjusted based on their design and composition. As to the shape of the MEJ devices, depending on the material, the in-plane configuration tends to perform better if the flat end surface were elliptical, oblong, rectangular, etc., so that the geometry is elongated in one direction (length is greater than the width). Otherwise, most of the MEJ devices have a more circular geometry on their ends, forming a nanopillar or column for the overall device. Typical lateral dimensions are smaller than 150 nm on each side, and may be scaled down to as small as approximately 3 nm by engineering the material structures to allow for stable memory operation at those dimensions.

In many embodiments, the diode is deposited after the MEJ material stack deposition, using a chemical vapor deposition (CVD), physical vapor deposition (PVD), or any combination of these techniques, followed by etching into the DIOMEJ cell. Alternatively, the diode is deposited before the MEJ material stack deposition. These embodiments are different from when the diode is fabricated on the front end and is then incorporated as a separate device at a separate processing or deposition stage. Furthermore, in several embodiments, the MEJ in combination with diodes are also possible if unipolar write voltages are used for flipping the spin in either direction, regardless of whether it has an out-of-plane or in-plane spin orientation.

Figure 16:
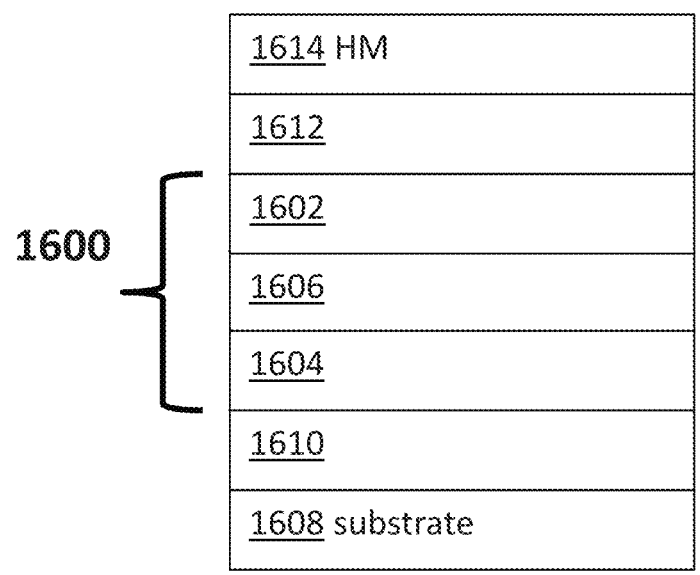
FIG. 16 illustrates implementing a hard mask during the manufacture of a DIOMEJ cell in accordance with embodiments of the invention.
Figure 17:
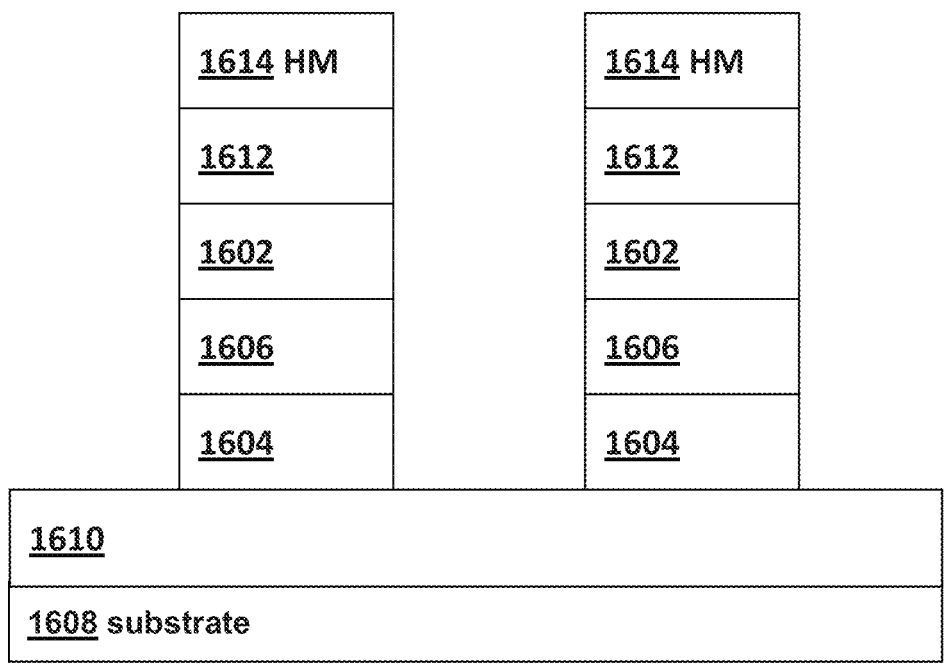
FIG. 17 depicts DIOMEJ cells that have been defined by an etching process during manufacture in accordance with embodiments of the invention.
Figure 18:
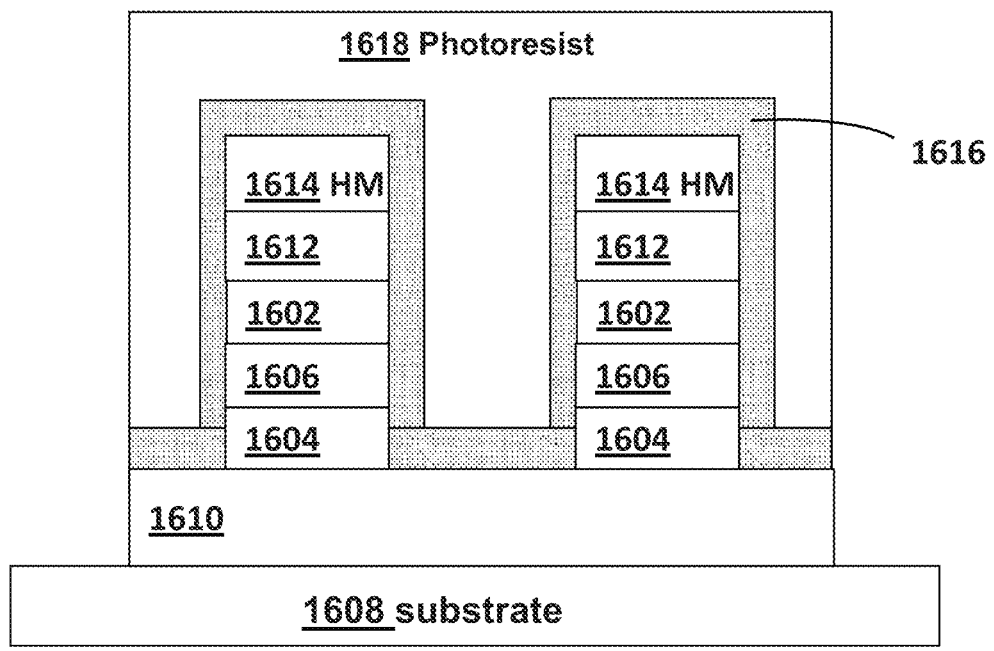
FIG. 18 illustrates the deposition of a spacer layer during the manufacture of a DIOMEJ cell in accordance with embodiments of the invention.
Figure 19:
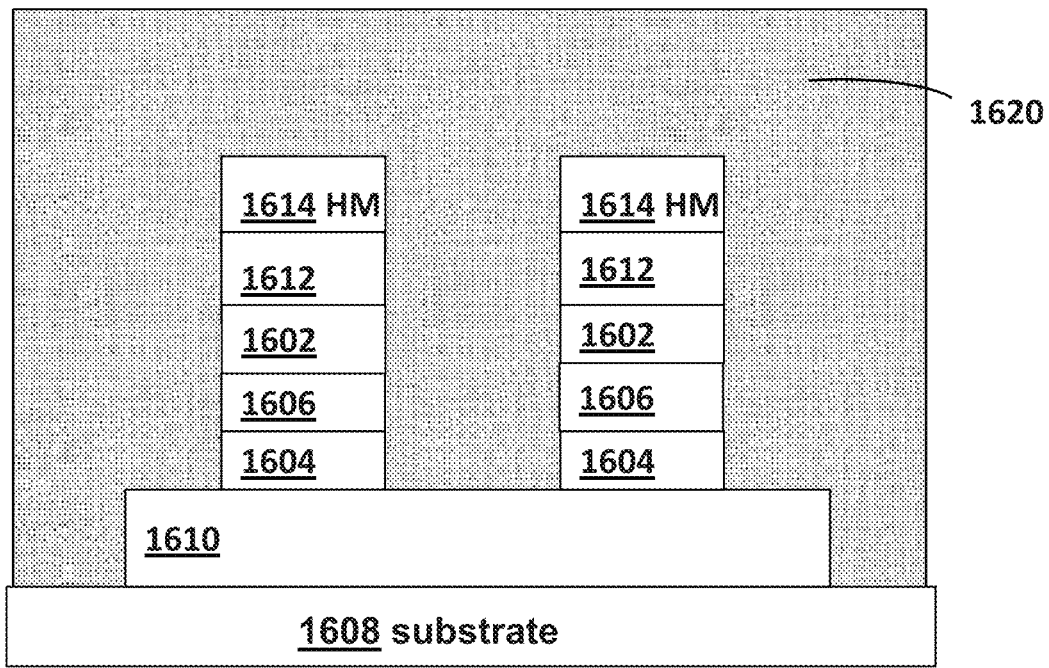
FIG. 19 illustrates the deposition of an oxide or nitride during the manufacture of a DIOMEJ cell in accordance with embodiments of the invention.
Figure 20:
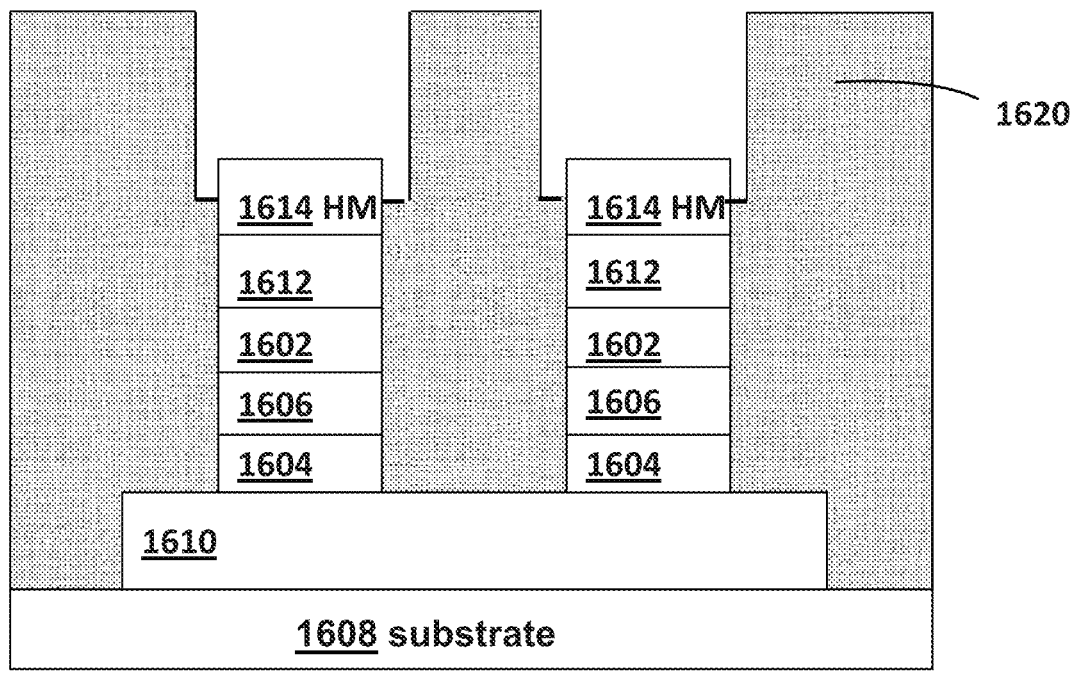
FIG. 20 illustrates the opening of an oxide or nitride during the manufacture of a DIOMEJ cell in accordance with embodiments of the invention.
Figure 21:
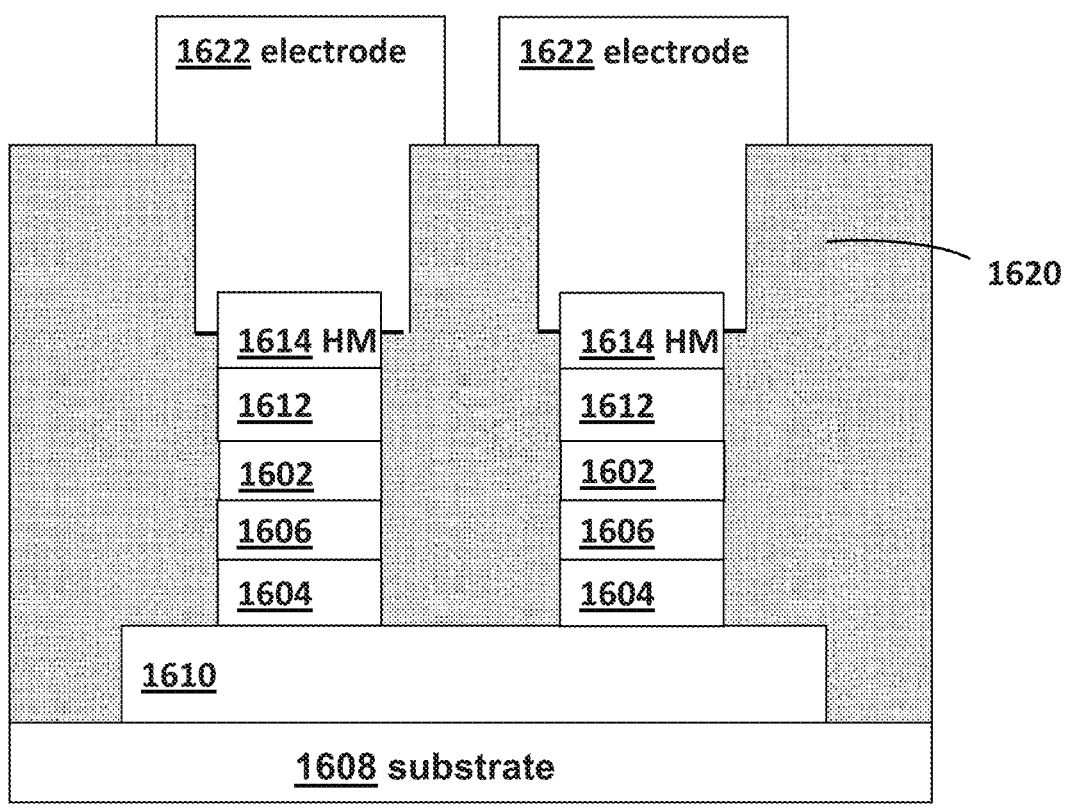
FIG. 21 illustrates the deposition of an electrode in accordance with embodiments of the invention.

In many embodiments, a manufacturing process flow for fabricating an entire array of DIOMEJ cells, for example for use in an MRAM configuration, is implemented. FIG. 16 illustrates an exemplary stage in the manufacturing process flow for an entire array of DIOMEJ cells. After the appropriate materials for the layers of the DIOMEJ cells 1600 and the electrodes 1610 and 1612 are formed, a hard mask layer 1614 is deposited above the top electrode layer 1612. FIG. 17 depicts the results after the individual DIOMEJ cells 1600 are defined by photolithography or other patterning techniques, and then etched out (e.g. reactive ion etch "RIE") and cleaned. FIG. 18 illustrates the deposition of a spacer layer 1616 made of an insulator or dielectric material. Photoresist 1618 or other light-sensitive material is applied. Then photolithography or other patterning defines the bottom end electrode 1610. Etching techniques, such as RIE, expose the bottom end electrodes 1610, as illustrated in FIG. 19. FIG. 19 also depicts the deposition of oxide or nitride 1620 that may later be polished. FIG. 20 illustrates the opening of the oxide or nitride 1620 to form a top electrode 1622 (shown in FIG. 21) and possibly for bottom electrodes), followed by photolithography and via etch. In FIG. 21, the via opening is filled so that there is top electrode 1622 deposition, followed by photolithography and etching. These top electrodes 1622 allow connections between DIOMEJ cells 1600 to form the entire memory array or to connect to other circuits.

Thus, the crossbar array may be realized as a back end process (i.e. within the metallization layers) of a standard or custom CMOS (or other transistor or semiconductor) process, and can thus be placed on top of the memory's peripheral and read/write circuitry. Multiple crossbar arrays can be stacked in the back end processing, to achieve a larger number of bits per area. Alternatively, upper levels of the stacked crossbar arrays comprise memory arrays fabricated on bare wafers to produce dies. Then the dice are stacked on top of one another and interconnected to the rest of the circuits.

Figure 22:
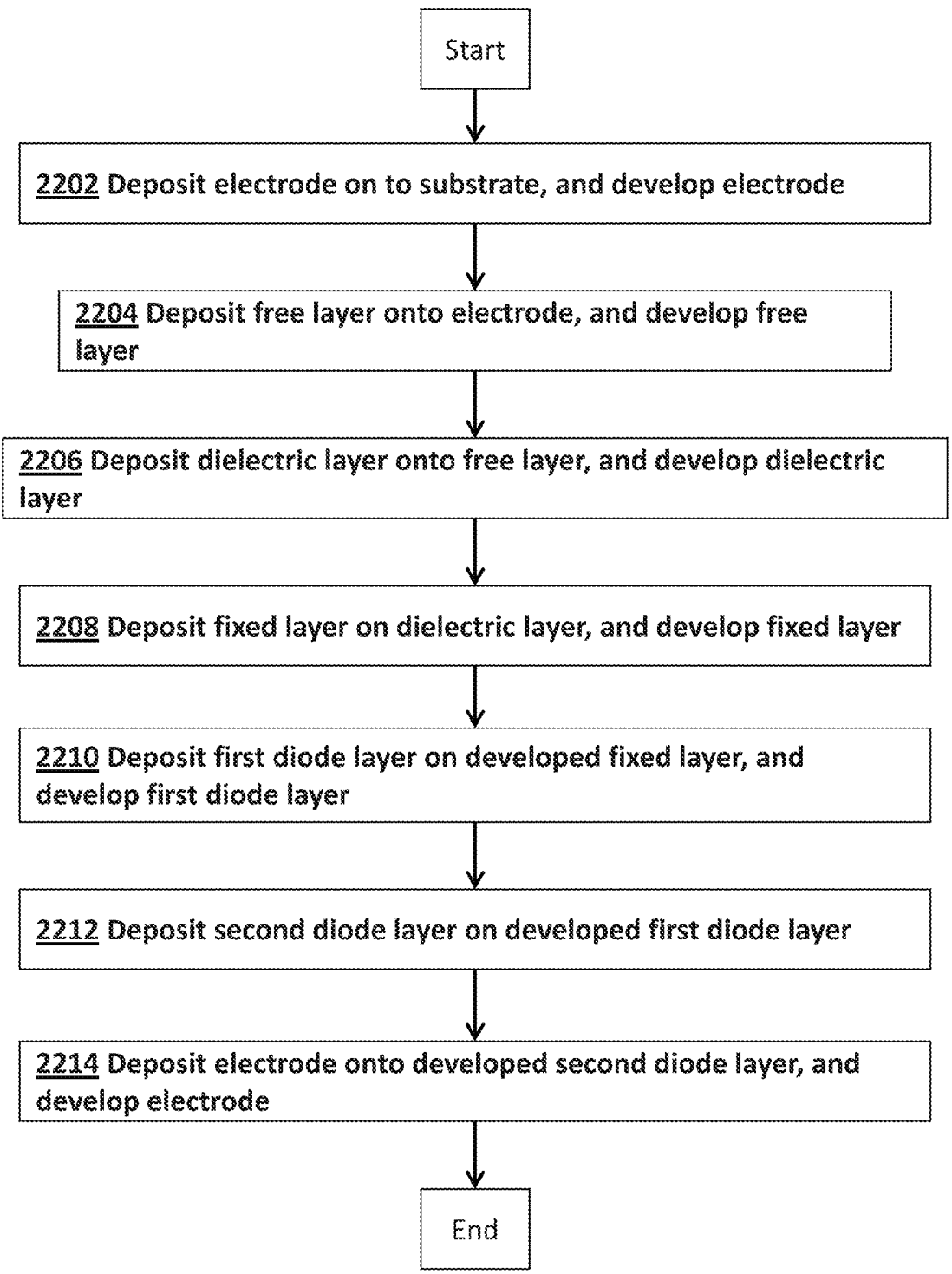
FIG. 22 illustrates a process for manufacturing a DIOMEJ cell in accordance with embodiments of the invention.

Generally, in many embodiments of the invention, DIOMEJ cells are fabricated by sequentially depositing their constituent layers onto a substrate. Thus, for instance in some embodiments, a DIOMEJ cell is fabricated by first depositing layers of an MEJ on a substrate, and subsequently depositing layers that constitute the diode. FIG. 22 illustrates a process for fabricating a DIOMEJ cell that includes an MEJ that has a free layer, a fixed layer, and a dielectric layer by first depositing the layers of MEJ and then depositing the layers that constitute the diode. Generally, an electrode is deposited 2202 on a substrate, and the electrode is then developed so that it possesses the desired properties. Any suitable methods of treatment can be used to develop the electrode, e.g. annealing, polishing, or any of the above mentioned treatments. A free layer of an MEJ is deposited 2204 on to the developed electrode; it may also be developed so that it has the desired properties using any suitable technique. A dielectric layer is deposited 2206 onto the developed free layer; it may also be developed so that it has the desired properties using any suitable technique. A fixed layer is deposited 2208 onto the developed dielectric layer; it may also be developed so that it has the desired properties using any suitable technique. A first diode layer is deposited 2210 onto the developed fixed layer; it may also be developed so that it has the desired properties using any suitable technique. A second diode layer is deposited 2212 onto the developed first diode layer; it may also be developed so that it has the desired properties using any suitable technique. An electrode layer is deposited 2214 onto the developed first diode layer; it may also be developed so that it has the desired properties using any suitable technique. Alternatively, some of the development steps may be combined or skipped as needed during the fabrication process. For example, if development of the layers involves high-temperature annealing, this may be done all at once after deposition of the entire stack, so that it affects the properties of all layers, or alternatively, after deposition of the MEJ free, fixed and dielectric layers, but before deposition of the diode layers, such as to only affect the properties of the MEJ layers. Of course, the illustrated process for manufacturing a DIOMEJ cell is meant to be illustrative. It is of course to be understood that many variations of this process can be implemented in accordance with embodiments of the invention. For instance, in many embodiments, the diode is electrically coupled to the free layer as opposed to the fixed layer. In some embodiments, a layer of metal is installed in between the MEJ and the diode. In a number of embodiments, the fixed and free layers include capping or seed materials. Thus many variations of the process of manufacturing DIOMEJ cells can be implemented in accordance with embodiments of the invention.

Finally, the orientation and directions stated and illustrated in this application should not be taken as limiting. For example, the directions, e.g. "top," are merely illustrative and do not orient the embodiments absolutely. That is, a structure formed on its "side" or "bottom" is merely an arbitrary orientation in space that has no absolute direction. Also, in actual usage, for example, a circuit may well be on its "side" because circuit boards may be oriented in any direction; and then, "top" is pointing to the "side." Thus, the stated directions in this application are arbitrary designations.

While certain features of the implementations have been illustrated and described herein, modifications, substitutions, changes and equivalents will occur to those skilled in the art. It is, therefore, to be understood that the claims are intended to cover all such modifications and changes that fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described. For example, other types of voltage-controlled magnetic junction devices may be substituted for the voltage controlled MEJ's depicted and described herein. It is to be understood that the magnetoelectric elements and arrays can be utilized in different embodiments and applications that may require tweaking to fit a particular situation and set of electronics. For instance, although the exemplary MEJs are described as having a fixed and free layer, it is also possible to use a "three" layer embodiment, where there are fixed, free and semi-fixed layers. Such a different MEJ would also be accompanied by a different range of voltages in order to perform the read and write operations. In addition, although the description referred most often to a MOS semiconductor process, other processes are possible. For example, in the automotive industry, a unified bipolar, CMOS and high voltage DMOS/LDMOS process is common and can incorporate the systems, devices and procedures described above. Bipolar, Bi-CMOS or Bi-Com, BCD, MEMS, semi-Optical, RF, mixed-signal and other processes are all possible.

What is claimed is:

1. A DIOMEJ cell comprising:
  a magnetoelectric junction, that itself comprises:
    a ferromagnetic fixed layer;
    a ferromagnetic, magnetically anisotropic, free layer; and
    a dielectric layer interposed between said ferromagnetic fixed layer and ferromagnetic, magnetically anisotropic, free layer;
    wherein the ferromagnetic fixed layer is magnetically polarized in a first direction;
    wherein the ferromagnetic, magnetically anisotropic, free layer has a first easy axis that is substantially aligned with the first direction, such that the ferromagnetic, magnetically anisotropic, free layer can adopt a magnetic polarity that is either parallel with or antiparallel with the first direction; and
    wherein the magnetoelectric junction is configured such that when a potential difference is applied across the magnetoelectric junction, the magnetic anisotropy of the ferromagnetic, magnetically anisotropic, free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference; and
  a diode;
  wherein the diode and the magnetoelectric junction are arranged in series.

2. The DIOMEJ cell of claim 1, wherein the first direction coincides with an in-plane direction.

3. The DIOMEJ cell of claim 1, wherein the first direction coincides with an out-of-plane direction.

4. The DIOMEJ cell of claim 1, wherein the coercivity of the ferromagnetic, magnetically anisotropic, free layer is reduced when a potential difference is applied across the magnetoelectric junction.

5. The DIOMEJ cell of claim 4, wherein the application of a first threshold potential difference across the ferromagnetic fixed layer and the ferromagnetic, magnetically anisotropic, free layer reduces the coercivity of the ferromagnetic, magnetically anisotropic, free layer to an extent where the strength of the magnetic field imposed by the ferromagnetic fixed layer is sufficient to magnetize the ferromagnetic, magnetically anisotropic, free layer.

6. The DIOMEJ cell of claim 5, wherein the application of a second threshold potential difference that is greater in magnitude than the first threshold potential difference causes a spin-transfer torque current to flow through the magnetoelectric junction;
  wherein the spin-transfer torque current magnetizes the ferromagnetic, magnetically anisotropic, free layer in a direction antiparallel with the first direction.

7. The DIOMEJ cell of claim 1, wherein the ferromagnetic fixed layer comprises one of: iron, nickel, manganese, cobalt, FeCoB, FeGaB, FePd, and FePt.

8. The DIOMEJ cell of claim 1, wherein the ferromagnetic, magnetically anisotropic, free layer comprises one of: iron, nickel, manganese, cobalt, FeCoB, FeGaB, FePd, and FePt.

9. The DIOMEJ cell of claim 1, wherein the dielectric layer comprises one of: MgO and $Al_2O_3$.

10. The DIOMEJ cell of claim 1, further comprising an externally applied magnetic field that is either parallel with or antiparallel with the magnetic polarization of the ferromagnetic fixed layer, wherein the externally applied magnetic field has a strength sufficient to magnetize the ferromagnetic, magnetically anisotropic, free layer when its coercivity is reduced with the application of a potential difference across the ferromagnetic fixed layer and the ferromagnetic free layer.

11. The DIOMEJ cell of claim 1, further comprising a seed layer.

12. The DIOMEJ cell of claim 11, wherein the seed layer comprises Tantalum.

13. The DIOMEJ cell of claim 1, further comprising:
  a second dielectric layer and a semi-fixed layer;
  wherein the second dielectric layer is interposed between the ferromagnetic, magnetically anisotropic, free layer and the semi-fixed layer;
  wherein the semi-fixed layer has a direction of magnetic polarization that is antiparallel with the direction of magnetic polarization of the ferromagnetic fixed layer; and wherein, when a potential difference is applied across the magnetoelectric junction, the magnetic anisotropy of the semi-fixed layer is altered such that the relative strength of the magnetic anisotropy along a third easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of a potential difference;

wherein the extent of this alteration is less than that of the ferromagnetic, magnetically anisotropic, free layer.

14. The DIOMEJ cell of claim 1, wherein the application of a potential difference pulse that has a duration that coincides with half of the precessional period of the ferromagnetic, magnetically anisotropic, free layer, or an odd multiple thereof, inverts the direction of magnetic polarization of the magnetoelectric junction.

15. A magneto-electric random access memory, comprising:

an array of DIOMEJ cells;
wherein each DIOMEJ cell comprises:
a magnetoelectric junction, that itself comprises:
a ferromagnetic fixed layer;
a ferromagnetic, magnetically anisotropic, free layer; and
a dielectric layer interposed between said ferromagnetic fixed layer and ferromagnetic, magnetically anisotropic, free layer;
wherein the ferromagnetic fixed layer is magnetically polarized in a first direction;
wherein the ferromagnetic, magnetically anisotropic, free layer has a first easy axis that is substantially aligned with the first direction, such that the ferromagnetic, magnetically anisotropic, free layer can adopt a magnetic polarity that is either parallel with or antiparallel with the first direction; and
wherein the magnetoelectric junction is configured such that when a potential difference is applied across the magnetoelectric junction, the magnetic anisotropy of the ferromagnetic, magnetically anisotropic, free layer is altered such that the relative strength of the magnetic anisotropy along a second easy axis that is orthogonal to the first easy axis, or the easy plane where there is no easy axis that is orthogonal to the first easy axis, as compared to the strength of the magnetic anisotropy along the first easy axis, is magnified or reduced for the duration of the application of the potential difference; and
a diode;
wherein the diode and the magnetoelectric junction are arranged in series;
a plurality of source lines; and
a plurality of bit lines;
wherein each DIOMEJ cell is electrically connected to a unique combination of a source line and a bit line, such that no other DIOMEJ cell is connected to the same bit line and the same source line; and
wherein a source line and a bit line can be used to establish a potential difference across a particular DIOMEJ cell.

16. The magneto-electric random access memory of claim 15, wherein for at least one DIOMEJ cell, the first direction coincides with an in-plane direction.

17. The magneto-electric random access memory of claim 15, wherein for at least one DIOMEJ cell, the first direction coincides with an out-of-plane direction.

18. The magneto-electric random access memory of claim 15, wherein for at least one DIOMEJ cell, the application of a first threshold potential difference across the ferromagnetic fixed layer and the ferromagnetic, magnetically anisotropic, free layer reduces the coercivity of the ferromagnetic, magnetically anisotropic, free layer to an extent where the strength of the magnetic field imposed by the ferromagnetic fixed layer is sufficient to magnetize the ferromagnetic, magnetically anisotropic, free layer.

19. The magneto-electric random access memory of claim 18, wherein, for the at least one DIOMEJ cell, the application of a second threshold potential difference that is greater in magnitude than the first threshold potential difference causes a spin-transfer torque current to flow through the magnetoelectric junction that magnetizes the ferromagnetic, magnetically anisotropic, free layer in a direction antiparallel with the first direction.

20. The magneto-electric random access memory of claim 15, wherein for at least one DIOMEJ cell, the coercivity of the ferromagnetic, magnetically anisotropic, free layer is reduced when a potential difference is applied across the magnetoelectric junction.

21. The magneto-electric random access memory of claim 15, wherein for at least one DIOMEJ cell, the application of a potential difference pulse that has a duration that coincides with half of the precessional period of the ferromagnetic, magnetically anisotropic, free layer, or an odd multiple thereof, inverts the direction of magnetic polarization of the magnetoelectric junction.

* * * * *